US006818465B2

(12) United States Patent
Biwa et al.

(10) Patent No.: US 6,818,465 B2
(45) Date of Patent: Nov. 16, 2004

(54) NITRIDE SEMICONDUCTOR ELEMENT AND PRODUCTION METHOD FOR NITRIDE SEMICONDUCTOR ELEMENT

(75) Inventors: Goshi Biwa, Kanagawa (JP); Hiroyuki Okuyama, Kanagawa (JP); Masato Doi, Kanagawa (JP); Toyoharu Oohata, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/415,010

(22) PCT Filed: Aug. 21, 2002

(86) PCT No.: PCT/JP02/08431

§ 371 (c)(1),
(2), (4) Date: Apr. 22, 2003

(87) PCT Pub. No.: WO03/019678

PCT Pub. Date: Mar. 6, 2003

(65) Prior Publication Data

US 2004/0048409 A1 Mar. 11, 2004

(30) Foreign Application Priority Data

Aug. 22, 2001 (JP) ........................................ 2001-252101
Jan. 18, 2002 (JP) ........................................ 2002-010529

(51) Int. Cl.$^7$ ............................................. H01L 21/00
(52) U.S. Cl. .............................. 438/22; 438/44; 438/47; 257/295; 257/190
(58) Field of Search .............................. 438/3, 44, 47, 438/481, 22, 46; 257/295, 103, 190, 79, 96, 76, 81, 99

(56) References Cited

U.S. PATENT DOCUMENTS 5,981,977 A   11/1999   Furukawa et al.
6,320,209 B1 * 11/2001   Hata et al. .................. 257/190

FOREIGN PATENT DOCUMENTS

| JP | 63-188938   | 8/1988  |
|----|-------------|---------|
| JP | 8-008217    | 1/1996  |
| JP | 9-129974    | 5/1997  |
| JP | 10-270801   | 10/1998 |
| JP | 10-312971   | 11/1998 |
| JP | 11-251253   | 9/1999  |
| JP | 11-312840   | 11/1999 |
| JP | 2000-068593 | 3/2000  |
| JP | 2000-183451 | 6/2000  |
| JP | 2000-223417 | 8/2000  |
| JP | 2001-085738 | 3/2001  |
| JP | 2001-217503 | 8/2001  |
| JP | 2002-313742 | 12/2002 |

OTHER PUBLICATIONS

Zheleva et al., Pendeo–epitaxy—a new approach for lateral growth of gallium nitride structures, MRS Internet J. Nitride Semicond. Res. 4S1, G3.38 (1999).

Kapolnek et al., *Spatial control of InGaN luminescence by MOCVD selective epitaxy*, Journal of Crystal Growth, 189/190 (1998) pp. 83–86.

* cited by examiner

*Primary Examiner*—Caridad Everhart
(74) *Attorney, Agent, or Firm*—Bell, Boyd & Lloyd LLC

(57) ABSTRACT

Nitride semiconductor devices and methods of fabricating same are provided. The nitride semiconductor device includes a crystal layer grown into a three-dimensional shape having a side surface portion and an upper layer portion, wherein an electrode layer is formed on the upper layer portion via a high resistance region formed by an undoped gallium nitride layer or the like. Since the high resistance region is provided on the upper layer portion, a current flows so as to bypass the high resistance region of the upper layer portion, to form a current path extending mainly or substantially along the side surface portion while avoiding the upper layer portion, thereby suppressing the flow of a current in the upper layer portion poor in crystallinity.

50 Claims, 18 Drawing Sheets

NITRIDE SEMICONDUCTOR ELEMENT AND PRODUCTION METHOD FOR NITRIDE SEMICONDUCTOR ELEMENT

This application is a 371 of PCT/JP02/08431 filed Aug. 21, 2002.

CROSS REFERENCE TO RELATED APPLICATION

This patent application claims priority to Japanese Patent Document No. P2001-252101 filed on Aug. 22, 2001 and Japanese Patent Document No. P2002-010529 filed on Jan. 18, 2002, the disclosures of which are herein incorporated by reference.

BACKGROUND OF THE INVENTION

The present invention relates to a nitride semiconductor device having a function such as light emission, which includes a nitride based semiconductor crystal layer formed by crystal growth and an electrode layer formed on the crystal layer, and a fabrication method thereof, and particularly to a nitride semiconductor device capable of realizing efficient current injection and a fabrication method thereof.

Nitride based III-V compound semiconductors such as GaN, AlGaN, and GaInN, each of which has a forbidden band width ranging from 1.8 eV to 6.2 eV, become a focus of attention in theoretically realizing light emitting devices allowing emission of light in a wide range from red light to ultraviolet right.

In fabrication of light emitting diodes (LEDs) and semiconductor lasers by using nitride based III-V compound semiconductors, it is required to form a stacked structure of layers made from GaN, AlGaN, GaInN and the like, wherein a light emitting layer (active layer) is held between an n-type cladding layer and a p-type cladding layer. As one example, there is known a light emitting diode or a semiconductor laser including a light emitting layer having a GaInN/GaN quantum-well structure or a GaInN/AlGaN quantum-well structure.

A vapor-phase growth technique for a nitride semiconductor such as a gallium nitride based compound semiconductor has an inconvenience that there is no substrate allowed to be lattice matched with a nitride semiconductor or a substrate having a low density of dislocations. To cope with such an inconvenience, there has been known a technique of depositing a low temperature buffer layer made from AlN or $Al_xGa_{1-x}N$ ($0 \leq x<1$) at a low temperature of 900° C. or less on a surface of a substrate made from sapphire or the like, and then growing a gallium nitride based compound semiconductor thereon, thereby reducing dislocations due to lattice mismatching between the substrate and the compound semiconductor. Such a technique has been disclosed, for example, in Japanese Patent Laid-open No. Sho 63-188938 and Japanese Patent Publication No. Hei 8-8217. By using such a technique, it is possible to improve the crystallinity and morphology of a gallium nitride based compound semiconductor.

Another technique of obtaining high quality crystal at a low density of dislocations has been disclosed, for example, in Japanese Patent Laid-open Nos. Hei 10-312971 and Hei 11-251253. This method involves depositing a first gallium nitride based compound semiconductor layer, forming a protective film made from a material capable of inhibiting growth of a gallium nitride based compound semiconductor, such as silicon oxide or silicon nitride, and growing a second gallium nitride based compound semiconductor in an in-plane direction (lateral direction) from regions, not covered with the protective film, of the first gallium nitride based compound nitride layer, thereby preventing propagation of threading dislocations extending in the direction perpendicular to the interface of the substrate. A further technique of reducing a density of threading dislocations has been disclosed, for example, in a document (MRS Internet J. Nitride Semicond. Res. 4S1, G3. 38 (1999), or Journal of Crystal Growth 189/190 (1998) 83–86). This method involves growing a first gallium nitride based compound semiconductor, selectively removing the thus formed semiconductor film by using a reactive ion etching (hereinafter, referred to as "RIE") system, and selectively growing a second gallium nitride based compound semiconductor from the remaining crystal in the growth apparatus, thereby reducing the density of threading dislocations. By using these techniques, it is possible to obtain a crystal film having a density of dislocations, which is reduced to about $10^6/cm^{-2}$, and hence to realize a high life semiconductor laser using the crystal film.

The selective growth is useful not only for reducing threading dislocations as described above but also for producing a semiconductor device having a three-dimensional structure. For example, a semiconductor device having a three-dimensional structure can be obtained by forming an anti-growth film on a gallium nitride based compound semiconductor film or a substrate, and selectively growing crystal from an opening portion formed in the anti-growth film, or by selectively removing a gallium nitride based compound semiconductor film or a substrate, and selectively growing from the remaining crystal. Such a semiconductor device has a three-dimensional structure having a facet composed of side planes and a top (upper surface) at which the side planes cross each other, and is advantageous in reducing a damage in the device isolation step, easily forming a current constriction structure of a laser, or improving the crystallinity by positively using characteristics of crystal planes forming the facet.

FIG. 30 is a sectional view showing one example of a nitride based light emitting device grown to a three-dimensional shape by selective growth, wherein the light emitting device is configured as a GaN based light emitting diode. An n-type GaN layer 331 is formed as an underlying growth layer on a sapphire substrate 330. A silicon oxide film 332 having an opening portion 333 is formed on the n-type GaN layer 331 so as to cover the n-type GaN layer 331. A hexagonal pyramid shaped GaN layer 334 is formed by selective growth from the opening portion 333 opened in the silicon oxide film 332.

If the principal plane of the sapphire substrate 330 is the C-plane, the GaN layer 334 becomes a pyramid shaped growth layer covered with the S-planes ({1,-1,0,1} planes). The GaN layer 334 is doped with silicon. The tilted S-plane portion of the GaN layer 334 functions as a cladding portion. An InGaN layer 335 is formed as an active layer so as to cover the tilted S-planes of the GaN layer 334, and an AlGaN layer 336 and a GaN layer 337 doped with magnesium are formed on the outside of the InGaN layer 335.

A p-electrode 338 and an n-electrode 339 are formed on such a light emitting diode. The p-electrode 338 is formed on the GaN layer 337 doped with magnesium by vapor-depositing a metal material such as Ni/Pt/Au or Ni(Pd)/Pt/Au. The n-electrode 339 is formed in an opening portion opened in the silicon oxide film 332 by vapor-depositing a metal material such as Ti/Al/Pt/Au.

FIG. 31 is a sectional view showing one example of a related art nitride based light emitting device grown into a three-dimensional shape by selective growth. Like the nitride semiconductor light emitting device shown in FIG. 30, an n-type GaN layer 351 is formed as an underlying growth layer on a sapphire substrate 350. A silicon oxide film 352 having an opening portion 353 is formed on the n-type GaN layer 351 so as to cover the n-type GaN layer 351. A hexagonal column shaped GaN layer 354 having a rectangular shape in cross-section is formed by selective growth from the opening portion 353 opened in the silicon oxide film 352.

The GaN layer is a region doped with silicon, and is grown to a growth layer having side planes composed of the {1,−1,0,0} planes by adjusting a growth condition for selective growth. An InGaN layer 355 is formed as an active layer so as to cover the GaN layer 354. A p-type AlGaN layer 356 and a p-type GaN layer 357 doped with magnesium are formed on the outer side of the InGaN layer 355.

A p-electrode 358 and an n-electrode 359 are formed on such a light emitting diode. The p-electrode 358 is formed on the GaN layer 357 doped with magnesium by vapor-depositing a metal material such as Ni/Pt/Au or Ni(Pd)/Pt/Au. The n-electrode 359 is formed in an opening portion opened in the silicon oxide film 352 by vapor-depositing a metal material such as Ti/Al/Pt/Au.

In the case of using such selective growth, however, there may occur an inconvenience that since the top or the upper surface is surrounded by the facet composed of the side planes low in growth rate, the supply of a source gas becomes too much on the top or the upper surface, tending to degrade the crystallinity of a portion on the top or the upper surface. Further, in the case where the area of the top or the upper surface is smaller than that of a substrate, it is difficult to control the film thickness and the composition of mixed crystal at the top or the upper surface. Accordingly, even in the case where a semiconductor light emitting device having a three-dimensional structure is formed by selective growth, there arise problems in degrading the crystallinity of the top or the upper surface, reducing the efficiency due to a nonradiative recombination, and causing leakage of a current because of irregular formation of PN-junction. Further, depending on the resistivity and thickness of a conductive layer being in contact with an electrode, a current is spread in the conductive layer, so that the current tends to be injected in the top or the upper surface, thereby degrading the device characteristics.

In the case of using selective growth, like the above-described top or the upper surface, a ridge portion as a crossing line portion between adjacent side surfaces and a region extending along the ridge portion, or a bottom side portion as a crossing line portion between a side surface and a bottom surface and a region extending along the bottom side portion are each poor in crystallinity. As a result, even on the ridge portion and the region extending along the ridge portion or the bottom side portion and the region extending along the bottom side portion, there may arise problems in reducing the efficiency due to nonradiative recombination, causing leakage of a current due to irregular formation of PN-junction, and the like.

Accordingly, a need exists to provide an improved nitride semiconductor device, such as to provide a nitride semiconductor device capable of obtaining excellent characteristics even if the device structure is grown to a three-dimensional shape by selective growth, and to provide a method of fabricating the nitride semiconductor device.

SUMMARY OF THE INVENTION

According to an embodiment of the present invention, a nitride semiconductor device is provided that includes a crystal layer grown in a three-dimensional shape having a side surface portion and an upper layer portion, wherein an electrode layer is formed on said upper layer portion via a high resistance region.

According to the nitride semiconductor device of an embodiment the present invention, a current for operating the nitride semiconductor device is injected from an electrode layer, and in this case, since the high resistance region is provided on the upper layer portion, the current flows so as to bypass the high resistance region of the upper layer portion, to form a current path extending mainly or substantially along the side surface portion while avoiding the upper layer portion. By using such a current path extending mainly along the side surface portion, it is possible to suppress the flow of the current in the upper layer portion poor in crystallinity.

According to an embodiment of the present invention, a nitride semiconductor device is provided that includes a crystal layer grown on a nitride semiconductor layer or a nitride semiconductor substrate, wherein said crystal layer includes a first crystal portion having a good crystal state and a second crystal portion having a crystal state poorer than that of said first crystal portion, and an electrode layer is formed on said second crystal portion via a high resistance region.

According to this nitride semiconductor device, since the electrode layer is formed on the second crystal portion via the high resistance region, a current path avoiding the second crystal portion is formed, to form a current path extending mainly via the first crystal portion good in crystallinity while bypassing the second crystal portion poor in crystallinity by the presence of the high resistance region. Accordingly, it is possible to make use of a portion good in crystallinity for an active device, and hence to optimize the device characteristics.

According to an embodiment of the present invention, a method of fabricating a nitride semiconductor device is provided that includes, the steps of forming a crystal layer on a nitride semiconductor layer or a nitride semiconductor substrate by selective growth, continuously forming a high resistance region by changing a crystal growth condition after formation of an upper layer portion of the crystal layer, and forming an electrode layer after formation of the high resistance region.

In the method of fabricating a nitride semiconductor device, said step of forming a crystal layer by selective growth includes the step of forming an anti-growth film on the nitride semiconductor layer or the nitride semiconductor substrate, and growing crystal from an opening portion opened in the anti-growth film, or includes the step of selectively removing part of the nitride semiconductor layer or the nitride semiconductor substrate, and growing crystal from the remaining portion of the nitride semiconductor layer or the nitride semiconductor substrate.

According to the method of fabricating a nitride semiconductor device of an embodiment the present invention, the crystal layer is formed by selective growth. In this case, the crystal layer is grown into a three-dimension al shape having an upper layer portion and a side surface portion by making use of selective growth. The resistance of the high resistance region formed continuously with this crystal growth becomes high by changing the crystal growth condition. Such a high resistance region functions to allow a current path from the electrode layer to bypass a portion poor in crystallinity. Since the high resistance region can be disposed in proximity to the upper layer portion of the crystal layer because it is formed continuously with the crystal growth of the crystal layer, it is possible to suppress the flow of a current in the upper layer portion poor is crystallinity.

According to an embodiment of the present invention, a nitride semiconductor device is provided that includes a crystal layer grown into a three-dimensional shape having a ridge portion, wherein an electrode layer is formed on both said ridge portion and a region extending along said ridge portion via a high resistance region. According to an embodiment of the present invention, there is also provided a nitride semiconductor device including a crystal layer grown into a three-dimensional shape, wherein an electrode layer is formed on both a bottom portion of said crystal layer and a region extending on said bottom portion via a high resistance region.

The high resistance region is formed by providing an undoped portion or an ion implanted portion formed by ion implantation, or selectively irradiating a nitride semiconductor layer doped with a p-type impurity with electron beams.

According to the nitride semiconductor device of an embodiment of the present invention, a current for operating the nitride semiconductor device is injected from an electrode layer, and in this case, since a high resistance region is formed on a ridge portion and a region extending along the ridge portion or a bottom side portion and a region extending along the bottom side portion, a current flows so as to bypass the high resistance region, to form a current path extending mainly along a side surface portion, concretely, along a flat surface portion composed of the side surface portion. By using such a current path, it is possible to suppress the flow of a current in the ridge portion poor in crystallinity and the region extending along the ridge portion or the bottom side portion and the region extending along the bottom side portion.

According to an embodiment of the present invention, a nitride semiconductor device is provided that includes a crystal layer grown into a three-dimensional shape, wherein an electrode layer is formed on a flat surface portion, other than a ridge portion and a region extending along said ridge portion, of said crystal layer. According to an embodiment of the present invention, there is also provided a nitride semiconductor device including a crystal layer grown into a three-dimensional shape, wherein an electrode layer is formed on a flat surface portion, other than a bottom side portion and a region extending along said bottom side portion, of said crystal layer.

According to the nitride semiconductor device of an embodiment of the present invention, a current for operating the nitride semiconductor device is injected from an electrode layer, and in this case, since the electrode layer is not formed on a ridge portion and a region extending along the ridge portion or a bottom side portion and a region extending along the bottom side portion, a current path mainly extending along a side surface portion on which the electrode layer is formed, concretely, along a flat surface portion composed of the side surface portion, can be formed. By using such a current path, it is possible to suppress the flow of a current in the ridge portion poor in crystallinity and the region extending along the ridge portion or the bottom side portion and the region extending along the bottom side portion.

Additional features and advantages of the present invention are described in, and will be apparent from, the following Detailed Description of the Invention and the figures.

DETAILED DESCRIPTION OF THE INVENTION

Figure 1:
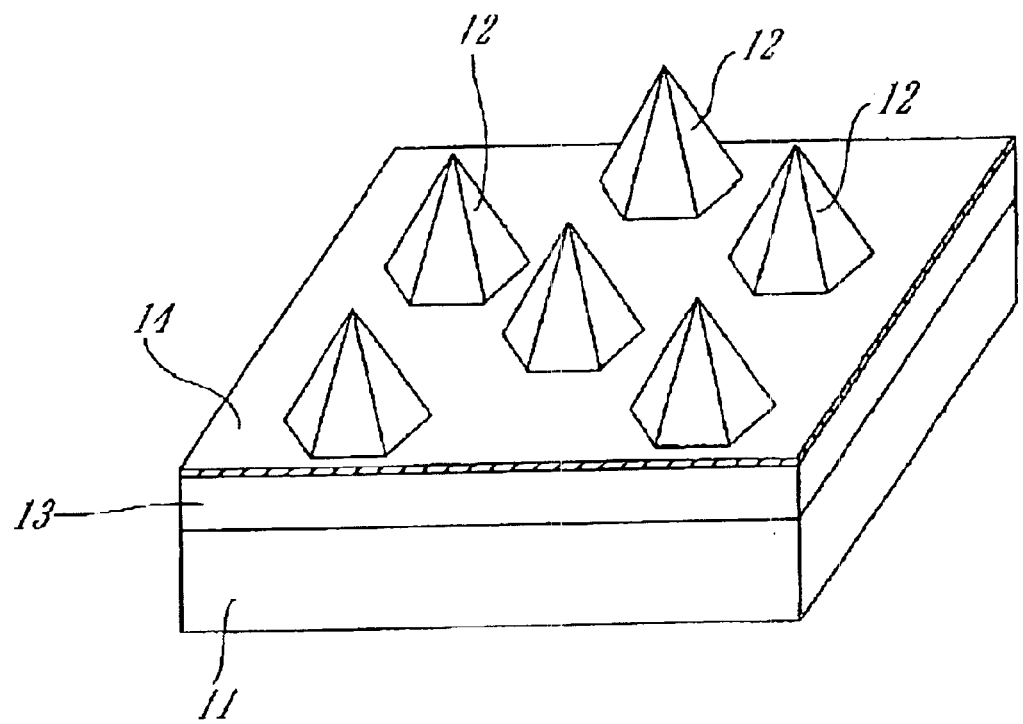
FIG. 1 is a perspective sectional view of a semiconductor light emitting device according to an embodiment of the present invention.

A nitride semiconductor device according to an embodiment of the present invention includes a crystal layer grown into a three-dimensional shape having a side surface portion and an upper layer portion, wherein the crystal layer has a structure that an electrode layer is formed on the upper layer portion via a high resistance region.

A nitride semiconductor device according to an embodiment of the present invention is characterized by includes a crystal layer grown into a three-dimensional shape, wherein the crystal layer has a structure that an electrode layer is formed on both a ridge portion and a region extending along the ridge portion via a high resistance region, or a structure that an electrode layer is not formed on both a ridge portion and a region extending along the ridge portion.

A nitride semiconductor device according to an embodiment of the present invention includes a crystal layer grown into a three-dimensional shape, wherein the crystal layer has a structure that an electrode layer is formed on both a bottom side portion and a region extending along the bottom side portion via a high resistance region, or a structure that an electrode layer is not formed on both a bottom side portion and a region extending along the bottom side portion.

The above-described structure that an electrode layer is not formed can be realized by forming an electrode layer over the entire surface and removing a portion, located on a ridge portion and its neighborhood and/or a bottom side portion and its neighborhood, of the electrode layer; previously forming an insulating film only in the vicinity of a ridge portion and/or a bottom side portion, and providing an electrode layer in such a manner that the electrode layer is not directly connected to the ridge portion and/or the bottom side portion; or wiring an electrode layer through a space separated from a ridge portion and its neighborhood and/or a bottom side portion and its neighborhood.

The term "three-dimensional shape" used in this specification means a three-dimensional structure composed of a nitride semiconductor layer or the like, wherein the three-dimensional structure has a side surface portion and an upper layer portion each of which is formed as a substantial crystal plane. Examples of such a three-dimensional structure may contain a polygonal pyramid structure, polygonal column structure, a projecting rib structure formed by making use of a stripe shaped opening portion and the like.

A crystal layer grown into a three-dimensional shape according to an embodiment of the present invention has a side surface portion and an upper layer portion as described above. Of these portions, the upper layer portion is an upper side region of the three-dimensional crystal layer. If a crystal layer is formed into a pyramid shape such as a hexagonal pyramid shape, the top portion and its neighborhood of the crystal layer are taken as an upper layer portion. If a crystal layer is formed into a pyramid shape with no peak portion, a region containing the upper end surface is taken as an upper layer portion. If a crystal layer is formed into a shape which is triangular in cross-section and which has a stripe shaped bottom surface, a ridge portion between tilt surfaces and its neighborhood are taken as an upper layer portion. If a crystal layer is formed into a trapezoidal shape with no ridge portion, the upper end surface and its neighborhood are taken as an upper layer portion. If a crystal layer is formed into a square column shape, a region containing the upper surface portion is taken as an upper layer portion. On the other hand, a side surface portion of a crystal layer is a region between an upper layer portion and a bottom surface portion of the crystal layer. If a crystal layer is formed into a pyramid shape such as a hexagonal pyramid shape, a tilted crystal plane of the pyramid shaped crystal layer is taken as a side surface portion. If a crystal layer is formed into a pyramid shape with no peak portion, a tilted crystal plane of the crystal layer is also taken as a side surface portion. If a crystal layer is formed into a shape which is triangular in cross-section and which has a stripe shaped bottom surface, or if a crystal layer is formed into a trapezoidal shape in cross-section with no ridge portion, a region located between an upper layer portion and a bottom surface portion and containing a tilted facet is taken as a side surface portion. If a crystal layer is formed into a square column shape, a region containing the upper surface portion of the square column is taken as an upper layer portion, and consequently, a side wall portion nearly perpendicular to the upper surface portion is taken as a side surface portion of the square column shaped crystal layer. An upper layer portion and a side surface portion can be made from the same material, and for example, if a crystal layer is formed into a pyramid shape, an upper layer portion composed of the top portion and its neighborhood can be made continuous to a side surface portion composed of a portion, extending from the underside of the upper layer portion to a bottom surface portion, of a tilted crystal plane.

A crystal layer grown to a three-dimensional shape according to an embodiment of the present invention has a ridge portion and a bottom side portion. The ridge portion is a crossing line portion between adjacent side surface portions or between a side surface portion and an upper end surface (upper surface portion). The bottom side portion is a crossing line portion between a bottom surface portion and a side surface portion. It is to be noted that in the following description, each of the ridge portion and the bottom side portion contains not only the crossing line portion but also a region extending along the crossing line portion.

In the case of growing a crystal layer into a three-dimensional shape according to an embodiment of the present invention, a sapphire substrate is typically used for crystal growth, wherein a growth underlying layer such as a buffer layer is formed on the sapphire substrate, and a crystal layer having a three-dimensional shaped facet structure is formed by selective growth from the growth underlying layer. In the case of forming a crystal growth layer by crystal growth, it is desirable that the crystal layer has a tilt plane tilted from the principal plane of a substrate, wherein the tilted plane is selected from the S-plane, the {1,1,−2,2} plane, and planes substantially equivalent thereto. For example, if the C-plane is used as the principal plane of a substrate, it is possible to easily form the S-plane as the tilted plane or a plane substantially equivalent thereto. In the case of forming a crystal layer by selective growth on the $C^+$-plane, the S-plane is a stable plane which is relatively easily, selectively grown on the $C^+$-plane. The S-plane is expressed by (1–101) in Miller index for a hexagonal system. The C-plane includes the $C^+$-plane and the $C^-$-plane, and similarly, the S-plane includes the $S^+$-plane and the $S^-$-plane. In this specification, unless otherwise specified, the $S^+$-plane, which is grown on the $C^+$-plane of a GaN layer, is taken as the S-plane. The $S^+$-plane is more stable than the $S^-$-plane. It is to be noted that the Miller index value of the $C^+$-plane is (0001). The nitride semiconductor device having the structure according to an embodiment of the present invention can be obtained by forming a crystal layer having a facet with the S-plane or the {1,1,−2,2} plane or a plane substantially equivalent thereto grown as a tilted plane tilted from the principal plane of a substrate, wherein the crystal layer has the above-described upper layer portion and side surface portion.

A crystal layer of the nitride semiconductor device of an embodiment the present invention is formed typically by a selective growth process. Such selective growth of a nitride semiconductor layer will be described below. The selective growth can be performed by making use of an anti-growth film or by making use of selective removal of the surface of a substrate or a semiconductor layer. The method using an anti-growth film includes the steps of forming an anti-growth film having an opening portion on a base body, putting the base body in such a state in a reaction chamber, and supplying a specific carrier gas and a source gas in the reaction chamber, to selectively form a nitride semiconductor layer from the opening portion of the anti-growth layer without deposition of the layer on the anti-growth layer. The method using selective removal of the surface of a substrate or a semiconductor layer includes the steps of selectively removing part of an underlying growth layer or a substrate so as to form irregularities on the surface thereof, and growing a three-dimensional crystal layer on the irregularities by supplying a specific carrier gas and a source gas.

A base body portion on which a crystal layer is to be grown may be selected from a substrate, for example, a nitride semiconductor substrate such as a gallium nitride based compound semiconductor substrate or a sapphire substrate, and a nitride semiconductor layer grown on a substrate. In the case of using the latter nitride semiconductor layer grown on a substrate as a base body portion, the substrate may be a substrate made from sapphire ($Al_2O_3$, whose crystal plane is preferably an A-plane, R-plane, or C-plane), SiC (whose structure is preferably 6H, 4H or 3C), GaN, Si, ZnS, ZnO, AlN, LiMgO, GaAs, $MgAl_2O_4$, or InAlGaN. Such a material of the substrate preferably has a hexagonal or cubic system, and more preferably, has a hexagonal system. For example, a sapphire substrate with the C-plane of sapphire taken as a principal plane thereof, which has been often used for growing a gallium nitride (GaN) based compound semiconductor thereon, is preferable. It is to be noted that the C-plane of sapphire taken as the principal plane of the substrate may be tilted from the strict C-plane by an angle ranging from 5° to 6°.

In the case of forming a nitride semiconductor layer as part of a base body, preferably, an underlying growth layer is formed on a substrate and the nitride semiconductor layer is formed on the substrate via the underlying growth layer. The underlying growth layer may be composed of, for example, a gallium nitride layer and a aluminum nitride layer, or may be composed of a combination of a low temperature buffer layer and a high temperature buffer layer or a combination of a buffer layer and a crystal seed layer functioning as a crystal seed. The underlying growth layer may be formed by a vapor-phase deposition process such as a metal-organic chemical vapor deposition (MOCVD) process, a molecular beam epitaxy (MBE) process, or a hydride vapor-phase epitaxy (HVPE) process.

In the case of forming a crystal layer by selective growth using an anti-growth film, the anti-growth film is formed on the above-described base body. The anti-growth film is composed of a silicon oxide film or a silicon nitride film, which film has a function of preventing deposition of a nitride semiconductor layer on a region covered with the anti-growth film. An opening portion is provided in the anti-growth film, wherein the surface of the base body is exposed from the bottom of the opening portion, and crystal growth proceeds in a range of the surface of the base body to the opening portion. The opening portion is formed by photolithography, and the shape of the opening portion is not particularly limited but may be a stripe shape, a circular shape, or a polygonal shape such as a hexagonal shape. If the opening portion is formed into a circular shape (or a hexagonal shape having a side extending in the 1–100 direction or 11–20 direction) having a dimension of about 10 μm, a crystal layer having a size being about twice the dimension of about 10 μm can be easily formed by selective growth from the opening portion. Also, if the S-plane is different from the principal plane of a substrate, it is possible to obtain an effect of bending and blocking dislocation propagated from the substrate and hence to reduce the density of the dislocations.

After the opening portion is formed in the antigrowth film on the base body, a nitride semiconductor layer is formed by selective growth from the opening portion. The nitride semiconductor layer is preferably made from a semiconductor material having a wurtzite type crystal structure. To be more specific, the nitride semiconductor layer may be made from a material selected from a group III based compound semiconductor, a BeMgZnCdS based compound semiconductor, a gallium nitride (GaN) based compound semiconductor, an aluminum gallium (AlN) based compound semiconductor, an indium nitride (InN) based compound semiconductor, an indium gallium nitride (InGaN) based compound semiconductor, an aluminum gallium nitride (AlGaN) based compound semiconductor and the like. Of these materials, an aluminum gallium nitride (AlGaN) based compound semiconductor is preferable. It is to be noted that in the present invention, the above-described ternary nitride based compound semiconductor such as InGaN or AlGaN does not necessarily mean only the nitride semiconductor strictly composed of a ternary mixed crystal, and similarly, the above-described binary nitride based compound semiconductor such as GaN does not necessarily mean only the nitride semiconductor strictly composed of a binary mixed crystal. For example, a nitride based compound semiconductor InGaN may contain a trace amount of Al or any other impurity in such a range as not to affect the function of InGaN without departing from the scope of the present invention.

The crystal layer may be grown by one of various vapor phase growth processes, for example, a metal-organic chemical deposition (MOCVD) (which is also called a metal-organic vapor-phase epitaxy (MOVPE) process), a molecular beam epitaxy (MBE) process, a hydride vapor-phase epitaxy (HVPE) process and the like. In particular, the MOVPE process is advantageous in rapidly growing the crystal layer with good crystallinity. In the MOVPE process, alkyl metal compounds are typically used as Ga, Al and In sources. Specifically, TMG (trimethyl gallium) or TEG (triethyl gallium) is used as the Ga source, TMA (trimethyl aluminum) or TEA (triethyl aluminum) is used as the Al source, and TMI (trimethyl indium) or TEI (triethyl indium) is used as the In source. Further, in the MOVPE process, a gas such as ammonia or hydradine is used as a nitrogen source; and silane gas is used as an Si (impurity) source, Cp2Mg (cyclopentadienyl magnesium) is used as a Mg (impurity) source, and DEZ (diethyl zinc) gas is used as a Zn (impurity) source. According to the MOVPE process, for example, an InAlGaN based compound semiconductor can be grown on a substrate by epitaxial growth by supplying the above gases to a front surface of the substrate heated, for example, at 600° C. or more, to decompose the gases.

The nitride semiconductor layer having a facet structure is typically formed by selective growth. For example, if the principal plane of a base body or a substrate has the $C^+$-plane, the S-plane can be formed as a stable tilted plane of crystal of the nitride semiconductor layer. The S-plane is a plane relatively obtainable by selective growth, which is expressed by (1–101) in Miller index for a hexagonal system. The C-plane includes the $C^+$-plane and the $C^-$-plane, and similarly, the S-plane includes the $S^+$-plane and the $S^-$-plane. In this specification, unless otherwise specified, the $S^+$-plane, which is grown on the $C^+$-plane of a GaN layer, is taken as the S-plane. The $S^+$-plane is stable than the $S^-$-plane. It is to be noted that the Miller index value of the $C^+$-plane is (0001). If the nitride semiconductor layer is made from a gallium nitride based compound semiconductor as described above, the number of bonds of gallium (Ga), which bonds are to be bonded to nitrogen (N), on the S-plane is two or three. The number of bonds of Ga to N on the S-plane is smaller than the number of bonds of Ga to N on the $C^-$-plane but is larger than the number of bonds of Ga to N on any other crystal plane. However, since the $C^-$-plane cannot be actually formed on the $C^+$-plane, the number of bonds of Ga to N on the S-plane is largest. For example, in the case of growing a wurtzite type nitride on a sapphire substrate with the C-plane taken as the principal plane, a surface of the nitride generally becomes the $C^+$-plane; however, the S-plane can be formed by making use of selective growth. On a plane parallel to the C-plane, nitrogen (N) is liable to be desorbed, and therefore, N is bonded to Ga by means of only one bond of Ga; whereas, on the tilted S-plane, N is bonded to Ga by means of at least one or more bonds of Ga. As a result, a V/III ratio is effectively increased, to improve the crystallinity of the stacked structure. Further, since the S-plane is grown in the direction different from that of the principal plane of the substrate, dislocations propagated upwardly from the substrate may be deflected. This is advantageous in reducing crystal defects. In the case of growing a crystal layer by selective growth using a selective growth mask, the crystal layer can be grown in the lateral direction to a shape larger than a window region. It is known that the lateral growth of the crystal layer by using microchannel epitaxy is advantageous in avoiding occurrence of threading dislocations thereby reducing the density of the dislocations. A light emitting device produced by making use of lateral growth of a crystal layer makes it possible to increase a light emitting region, and to equalize a current, avoid the concentration of a current, and reduce a current density.

A nitride semiconductor layer formed by selective growth has a facet structure composed of the S-plane or a plane substantially equivalent thereto. With respect to such a nitride semiconductor layer, typically, as the growth proceeds, the area of a plane parallel to the principal plane of a substrate becomes gradually smaller. In other words, since the nitride semiconductor layer is grown into a pyramid shape with the tilt planes, the area of a plane parallel to the principal plane of the substrate becomes gradually smaller as nearing the top portion. The term "top portion" means a peak portion at which tilt planes cross each other; a region at which ridge portions cross each other if the nitride semiconductor layer is grown from a striped opening portion; or a region which is highest if the nitride semiconductor layer is grown into a hexagonal pyramid shape.

The nitride semiconductor device according to an embodiment of the present invention has a structure that a high resistance region is formed on an upper layer portion of a three-dimensional crystal layer. The high resistance region is provided for shifting a path of a current injected in the nitride semiconductor device to the side surface side thereof. For example, in the case of forming a light emitting device by forming an n-type nitride semiconductor layer as a first conductive region on an upper layer of a crystal layer, and forming an active layer and a p-type nitride semiconductor layer as a second conductive layer on the n-type nitride semiconductor region, it is desirable to form a top portion such that a resistance value between the top portion of the n-type layer and the top portion of the p-type layer is larger than a resistance value between the side surface portion of the n-type layer and the side surface portion, being in contact therewith, of the p-type layer. If the resistance between the top portion of the n-type layer and the top portion of the p-type layer is smaller than the resistance between the side surface portion of the n-type layer and the side surface portion of the p-type layer, a current flows between the top portion of the n-type layer and the top portion of the p-type layer, that is, the current flows in an active layer poor in crystallinity, to thereby cause inconveniences that the luminous efficiency is reduced and reactive current occurs. From the viewpoint of repeatability, the resistance value between the top portion of the n-type layer and the top portion of the p-type layer (resistance value between the upper layer portion and the electrode layer) is preferably 1.5 times or more larger than the resistance value between the side surface portion of the n-type layer and the side surface portion of the p-type layer (resistance value between the side surface portion and the electrode layer). Further, from the viewpoint of improving characteristics at the time of increasing the voltage or current density, the resistance between the upper layer portion and the electrode layer is preferably two times or more larger than the resistance between the side surface portion and the electrode layer.

The high resistance region is formed by an undoped nitride semiconductor layer, a nitride semiconductor layer doped with a p-type impurity, or a nitride semiconductor layer doped with an n-type impurity. In the case of forming the high resistance region by using the nitride semiconductor layer, after an upper layer portion of a crystal layer is formed, the high resistance region can be continuously formed thereon by changing a crystal growth condition. To be more specific, after the upper layer portion of the crystal layer is formed, the high resistance region can be continuously formed thereon by changing the crystal growth condition such as supply and stoppage of an impurity gas or the control of the concentration of the impurity gas while leaving a substrate for device formation in the same reaction chamber. For example, in the case of forming an undoped nitride semiconductor layer, the supply of an impurity gas may be stopped; in the case of forming a nitride semiconductor layer doped with a p-type impurity, an impurity such as magnesium may be introduced; and in the case of forming a nitride semiconductor layer doped with an n-type impurity, an impurity such as silicon may be introduced. An undoped nitride semiconductor layer taken as the high resistance region contains an impurity at an extremely low concentration. With respect to a nitride semiconductor layer doped with a p-type impurity, if the p-type nitride semiconductor layer is surrounded by an n-type nitride semiconductor layer as a nitride semiconductor layer having the opposed conduction type, it forms pn-junction at the interface therebetween, and if the p-type nitride semiconductor layer is surrounded by a p-type nitride semiconductor layer as a nitride semiconductor layer having the same conduction type, the impurity concentration of the p-type nitride semiconductor layer in question is made lower, so that the p-type nitride semiconductor layer in question is taken as a high resistance region as compared with the surrounding layer, to thus obtain a function of shifting a current path to the side surface side. Similarly, with respect to a nitride semiconductor layer doped with an n-type impurity, if the n-type nitride semiconductor layer is surrounded by a p-type nitride semiconductor layer as a nitride semiconductor layer having the opposed conduction type, it forms pn-junction at the interface therebetween, and if the n-type nitride semiconductor layer is surrounded by an n-type nitride semiconductor layer as a nitride semiconductor layer having the same conduction type, the impurity concentration of the n-type nitride semiconductor layer in question is made lower, so that the n-type nitride semiconductor layer in question is taken as a high resistance region as compared with the surrounding layer, to thus obtain a function of shifting a current path to the side surface side. The high resistance region may be made from a material identical to or different from that of a nitride semiconductor layer forming a crystal layer. For example, the crystal layer may be formed of a GaN based semiconductor layer, and the high resistance region may be formed of an AlGaN based semiconductor layer.

As described above, the high resistance region can be formed by controlling an impurity to be doped in a nitride semiconductor layer; however, it may be formed by directly forming an insulating film such as a silicon oxide film or a silicon nitride film on an upper layer portion of a crystal layer or indirectly forming the insulating film on the upper layer portion of the crystal layer via another layer such as an active layer. The insulating film such as a silicon oxide film or a silicon nitride film is not limited to be used singly but may be combined with another insulating film, an undoped compound semiconductor layer, or any other semiconductor layer.

According to the nitride semiconductor device of an embodiment of the present invention, a high resistance region may be formed on a ridge portion of a three-dimensional crystal layer. The high resistance region can be formed by forming an undoped portion on the ridge portion of the crystal layer; implanting ions (by an ion implantation process); or selectively irradiating a p-type nitride semiconductor layer with electron beams. According to the nitride semiconductor device of an embodiment of the present invention, a high resistance region may be formed on a bottom side portion of a three-dimensional crystal layer in the same manner as that used for forming the high resistance region on the ridge portion.

As described above, a high resistance region is formed on an upper layer, a ridge portion, or a bottom side portion of a three-dimensional crystal layer, and in the case of forming a semiconductor light emitting device as the nitride semiconductor device of the present invention, an active layer is formed before or after the high resistance region is formed. In other words, the high resistance region can be formed under or over the active region. An electrode layer is formed on the crystal layer via such a high resistance region. The electrode layer may be made from Ni/Pt/Au or the like, and another electrode layer as a counter electrode layer may be made from Ti/Al or the like.

According to an embodiment of the present invention, to efficiently inject a current in a side surface portion of a crystal layer, in place of formation of the above-described high resistance region, an electrode layer may be formed only on a flat surface portion composed of the side surface portion except for a ridge portion and a bottom side portion. It is to be noted that if a crystal layer has an upper end surface and an upper layer portion, the flat surface portion includes both the upper end surface and the upper surface portion.

The nitride semiconductor device according to an embodiment of the present invention may have any device structure operable by making use of a semiconductor, and for example, it may be applicable to a semiconductor light emitting device such as a light emitting diode or a semiconductor laser, and further, to a field-effect transistor or a light receiving device.

In the nitride semiconductor device having such a structure according to an embodiment of the present invention, a current is injected to the device mainly via a side surface portion by the presence of a high resistance region formed on an upper layer portion, a ridge portion, or a bottom side portion. In particular, in the case of forming the high resistance region on the upper layer portion, since in crystal growth of a gallium nitride based compound semiconductor, the balance between the growth and elimination of a facet and the surface to be grown can be generally controlled by a growth condition such as a growth rate, a growth temperature, or a ratio between sources for a group III element and a group V element, the high resistance region can be continuously formed on the upper layer portion by changing the growth condition during growth. Accordingly, the high resistance region can be formed in the vicinity of an active layer, so that it is possible to suppress leakage of a current due to spread of the current and a nonradiative recombination.

According to the nitride semiconductor device of an embodiment of the present invention, it is possible to efficiently inject a current mainly via a side surface portion by forming an electrode layer not on a ridge portion or a bottom side portion but on a flat surface portion composed of the side surface portion. It is to be noted that if a crystal layer has an upper end surface and an upper surface portion, the flat surface portion includes both the upper end surface and the upper surface portion.

The present invention will be described below in detail with reference to embodiments or examples illustrative of the present invention. It is to be noted that the nitride semiconductor device of the present invention can be changed or modified without departing from the scope of the present invention, and therefore, the present invention is not limited to the following embodiments or examples illustrative of the present invention.

According to an embodiment, as shown in FIG. 1, a hexagonal pyramid shaped nitride semiconductor light emitting device structure 12 is formed on a sapphire substrate 11 by selective growth, and an electrode is formed on a portion of the hexagonal pyramid shaped (three-dimensional shaped) nitride semiconductor light emitting device structure 12, whereby the nitride semiconductor light emitting device structure 12 functions as a light emitting diode. A gallium nitride layer 13, which has a stacked structure of an undoped GaN layer and a silicon-doped GaN layer stacked thereon, is formed on the sapphire substrate 11, and a silicon oxide film 14 is formed to cover the gallium nitride layer 13. The silicon oxide film 14 functions as an anti-growth film at the time of selective growth. The hexagonal pyramid shaped nitride semiconductor light emitting device structure 12 is formed by selective growth from an opening portion formed in the silicon oxide film 14.

Figure 2:
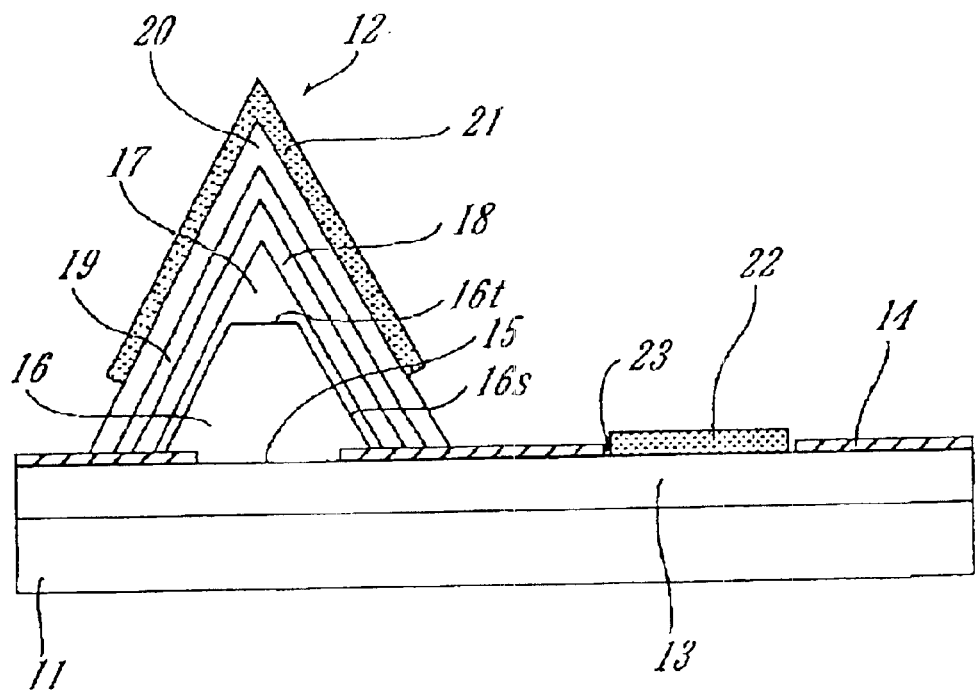
FIG. 2 is a sectional view of the semiconductor light emitting device according to an embodiment of the present invention.

FIG. 2 is a sectional view showing an inner configuration of the hexagonal pyramid shaped nitride semiconductor light emitting device structure 12, with a p-electrode and an n-electrode formed thereto. The n-type gallium nitride layer 13 having the stacked structure of the undoped GaN layer and the silicon-doped GaN layer stacked thereon is formed on the sapphire substrate 11, and the silicon oxide film 14 is formed to cover the gallium nitride layer 13. Opening portions 15, each having a nearly normal hexagonal shape, are formed in the silicon oxide film 14, and an n-type GaN layer 16 is formed by selective growth from each of the opening portions 15. The sapphire substrate 11 is a substrate using the C-plane of sapphire as the principal plane, and one side of the normal hexagonal opening portion 15 is set to be in parallel to the [1,1,-2,0] direction. In general, in the case of selective growth using such an opening portion 15, a hexagonal pyramid shaped growth layer having S-planes ({1,-1,0,1} plane) as tilt side surfaces are formed by adjusting growth conditions. The silicon-doped n-type gallium nitride layer 16 is thus formed by selective growth using the opening portion 15.

The n-type gallium nitride layer 16 is formed by making a mixed gas of $H_2$ and $N_2$ as a carrier gas flow in a reaction chamber and supplying ammonia ($NH_3$) as an N source and trimethyl gallium (TMGa, $Ga(CH_3)_3$) as a Ga source. The n-type gallium nitride layer 16 is doped with silicon as an impurity.

The growth of the n-type gallium nitride layer 16 is stopped before the gallium nitride layer 16 becomes a perfect hexagonal pyramid shape. By stopping the supply of the impurity gas at that time, an undoped gallium nitride layer 17 is grown. Since the switching of the impurity gas by stopping the supply thereof is continuously performed in the same reaction chamber, it does not inhibit the productivity. The undoped gallium nitride layer 17, which is a nitride semiconductor layer containing the impurity at an extremely low concentration, acts as a high resistance region for preventing the flow of a current in an upper layer portion.

The switching of the growth layer by stopping the impurity gas stops the growth of the n-type gallium nitride layer 16, with a result that the n-type gallium nitride layer 16 is formed into a hexagonal pyramid shape with no peak portion, wherein an upper plane portion with no peak portion is taken as an upper layer portion 16t and S-plane portions of the tilted crystal layer are taken as side surface portions 16s. The undoped gallium nitride layer 17 has an upper portion having an approximately triangular shape in cross-section, which portion is located on the upper layer portion 16t as the top portion, and has thin side surface portions located on the side surface portions 16s so as to cover the peripheries of the side surface portions 16s. Since the upper layer portion 16t of the n-type gallium nitride layer 16 is continuous to the undoped gallium nitride layer 17 functioning as the high resistance region, a current flowing via the upper layer portion 16t is suppressed, with a result that a current flowing in an active layer, which is to be formed on the undoped gallium nitride layer 17, is also suppressed.

An InGaN active layer 18 containing indium is formed on the undoped gallium nitride layer 17, and a p-type AlGaN layer 19 and a p-type gallium nitride layer 20 are stacked thereon. The p-type AlGaN layer 19 and the p-type gallium nitride layer 20 are each doped with magnesium as an impurity. A p-electrode 21 is formed on the p-type gallium nitride layer 20 by vapor-depositing a metal material such as Ni/Pt/Au or Ni(Pd)/Pt/Au. An n-electrode 22 is formed in an opening portion 23 opened in the silicon oxide film 14 by vapor-depositing a metal material such as Ti/Al/Pt/Au.

In the nitride semiconductor device having such a structure according to this embodiment, the undoped gallium nitride layer 17 functioning as the high resistance region is formed under the InGaN active layer 18, wherein the undoped gallium nitride layer 17 functions to suppress a current flowing to the n-type gallium nitride layer 16 via the upper layer portion 16t and to allow the flow of the current in the n-type gallium nitride layer 16 mainly via the side surface portions 16s. Accordingly, the current is efficiently injected to the side surface portions 16s more than to the top portion side, to obtain a light emitting diode high in luminous efficiency with less leaked current.

According to an embodiment, the opening portion 15 formed in the silicon oxide film 14 is configured to have a nearly normal hexagonal shape; however, the present invention is not limited thereto. For example, the shape of the opening portion 15 may be another polygonal shape or a circular shape. Even in this case, a crystal growth layer having a hexagonal pyramid shape similar to that described above can be formed from the opening portion 15 by adjusting a growth condition. The tilt side surface of the crystal growth layer is not limited to the S-plane but may be the {1,1,-2,2} plane. Even in this case, like the above-described light emitting device obtained using the S-planes, a light emitting device obtained using the {1,1,-2,2} planes can suppress the leaked current.

Figure 3:
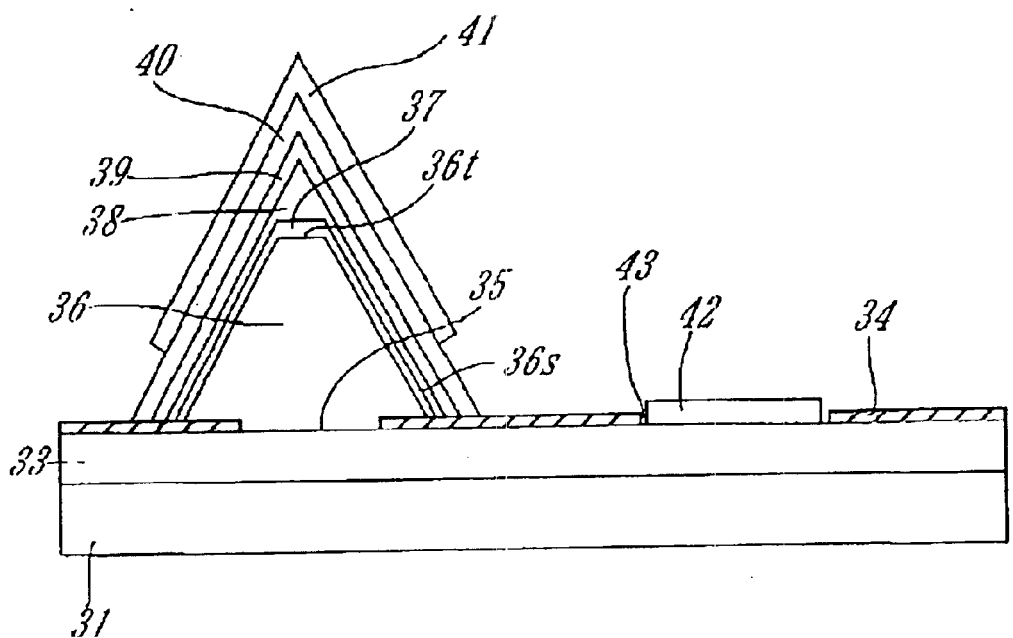
FIG. 3 is a sectional view of a semiconductor light emitting device according to an embodiment of the present invention.

According to an embodiment, as shown in FIG. 3, a high resistance region is formed on an active layer. A light emitting device in an embodiment is the same as described above in terms of formation of a hexagonal pyramid shaped nitride semiconductor light emitting device structure but is different therefrom in terms of the internal structure of the nitride semiconductor light emitting device structure.

FIG. 3 is a sectional view showing an inner configuration of a nitride semiconductor light emitting device structure according to an embodiment, with a p-electrode and an n-electrode formed thereto. An n-type gallium nitride layer 33 having a stacked structure of an undoped GaN layer and a silicon-doped GaN layer stacked thereon is formed on a sapphire substrate 31, and a silicon oxide film 34 is formed to cover the gallium nitride layer 33. Opening portions 35, each having a nearly normal hexagonal shape, are formed in the silicon oxide film 34, and an n-type GaN layer 36 is formed by selective growth from each of the opening portions 35. The sapphire substrate 31 is a substrate using the C-plane of sapphire as the principal plane, and one side of the normal hexagonal opening portion 35 is set to be in parallel to the [1,1,−2,0] direction. The silicon-doped n-type gallium nitride layer 36 is thus formed by selective growth using the opening portion 35.

The n-type gallium nitride layer 36 is formed by making a mixed gas of $H_2$ and $N_2$ as a carrier gas flow in a reaction chamber. The n-type gallium nitride layer 36 is doped with silicon as an impurity. The growth of the n-type gallium nitride layer 36 is stopped before the gallium nitride layer 36 becomes a perfect hexagonal pyramid shape. At such a stopped point of time, by switching the gas into a gas containing TMI (trimethyl indium) or TEI (triethyl indium), an InGaN active layer 37 is formed in such a manner as to cover an upper layer portion 36t and side surface portions 36s of the n-type gallium nitride layer 36.

After formation of the InGaN active layer 37, the crystal growth is further continued to form an undoped gallium nitride layer 38. The undoped gallium nitride layer 38 is a nitride semiconductor layer containing the impurity at an extremely low concentration, and acts as a high resistance region for preventing the flow of a current in an upper layer portion. The undoped gallium nitride layer 38 has an upper portion having an approximately triangular shape in cross-section, which portion is located over the upper layer portion 36t as the top portion, and has thin side surface portions located over the side surface portions 36s so as to cover the periphery of the InGaN active layer 37. Since the upper layer portion 36t is continuous to the undoped gallium nitride layer 38 functioning as the high resistance region via the InGaN active layer 37, a current flowing in the InGaN active layer 37, which is formed under the undoped gallium nitride layer 38 and on the upper layer portion 36t, is suppressed.

A p-type AlGaN layer 39 and a p-type gallium nitride layer 40 are stacked on the undoped gallium nitride layer 38. The p-type AlGaN layer 39 and the p-type gallium nitride layer 40 are each doped with magnesium as an impurity. A p-electrode 41 is formed on the p-type gallium nitride layer 40 by vapor-depositing a metal material such as Ni/Pt/Au or Ni(Pd)/Pt/Au. An n-electrode 42 is formed in an opening portion 43 opened in the silicon oxide film 34 by vapor-depositing a metal material such as Ti/Al/Pt/Au.

In the nitride semiconductor device having such a structure according to an embodiment, the undoped gallium nitride layer 38 functioning as the high resistance region is formed on the InGaN active layer 37, wherein the undoped gallium nitride layer 38 functions to suppress a current flowing to the n-type gallium nitride layer 36 via the upper layer portion 36t and to allow the flow of the current in the n-type gallium nitride layer 36 mainly via the side surface portions 36s. Accordingly, the current is efficiently injected to the active layer of the side surface portions 36s more than to the top portion side, to obtain a light emitting diode high in luminous efficiency with less leaked current.

According to an embodiment, the opening portion 35 formed in the silicon oxide film 34 is configured to have a nearly normal hexagonal shape; however, the present invention is not limited thereto. For example, the shape of the opening portion 35 may be another polygonal shape or a circular shape. Even in this case, a crystal growth layer having a hexagonal pyramid shape similar to that described above can be formed from the opening portion 35 by adjusting a growth condition. The tilt side surface of the crystal growth layer is not limited to the S-plane but may be the {1,1,−2,2} plane. Even in this case, like the above-described light emitting device obtained using the S-planes, a light emitting device obtained using the {1,1,−2,2} planes can suppress the leaked current.

Figure 4:
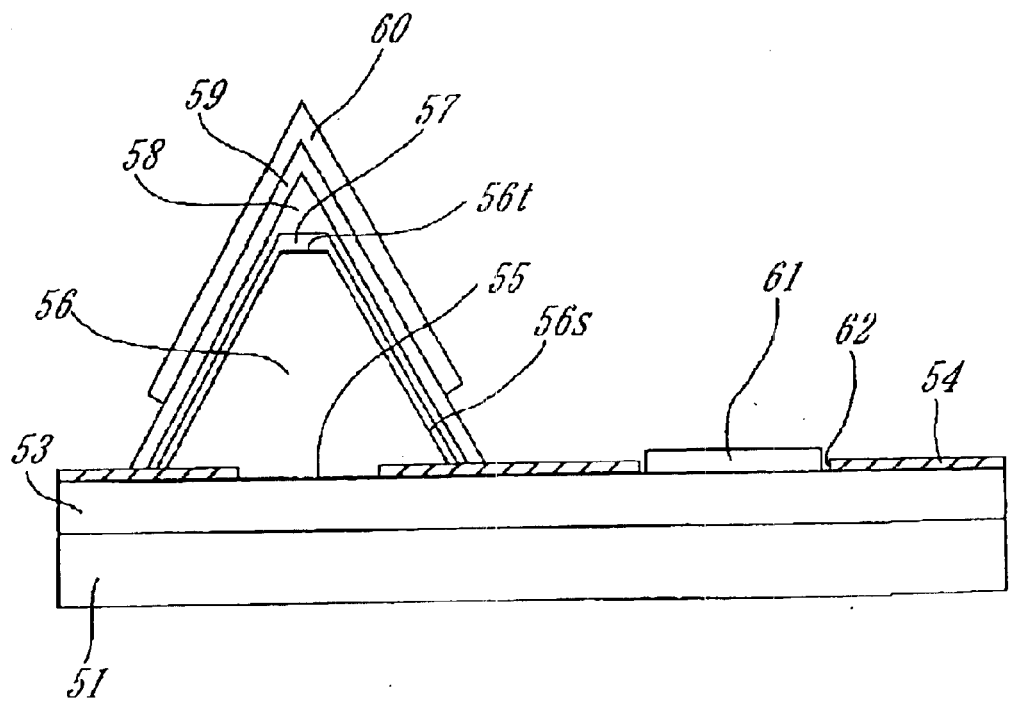
FIG. 4 is a sectional view of a semiconductor light emitting device according to an embodiment of the present invention.

According to an embodiment, as shown in FIG. 4, a high resistance region is formed on an active layer by using a p-type nitride semiconductor layer. A light emitting device in an embodiment is the same as described above in terms of formation of a hexagonal pyramid shaped nitride semiconductor light emitting device structure but is different therefrom in terms of the internal structure of the nitride semiconductor light emitting device structure.

FIG. 4 is a sectional view showing an inner configuration of a nitride semiconductor light emitting device structure according to an embodiment, with a p-electrode and an n-electrode formed thereto. An n-type gallium nitride layer 53 having a stacked structure of an undoped GaN layer and a silicon-doped GaN layer stacked thereon is formed on a sapphire substrate 51, and a silicon oxide film 54 is formed to cover the gallium nitride layer 53. Opening portions 55, each having a nearly normal hexagonal shape, are formed in the silicon oxide film 54, and an n-type GaN layer 56 is formed by selective growth from each of the opening portions 55. The sapphire substrate 51 is a substrate using the C-plane of sapphire as the principal plane, and one side of the normal hexagonal opening portion 55 is set to be in parallel to the [1,1,−2,0] direction. The silicon-doped n-type gallium nitride layer 56 is thus formed by selective growth using the opening portion 55.

The n-type gallium nitride layer 56 is formed by making a mixed gas of $H_2$ and $N_2$ as a carrier gas flow in a reaction chamber. The n-type gallium nitride layer 56 is doped with silicon as an impurity. The growth of the n-type gallium nitride layer 56 is stopped before the gallium nitride layer 56 becomes a perfect hexagonal pyramid shape. At such a stopped point of time, by switching the gas into a gas containing TMI (trimethyl indium) or TEI (triethyl indium), an InGaN active layer 57 is formed in such a manner as to cover an upper layer portion 56t and side surface portions 56s of the n-type gallium nitride layer 56.

After formation of the InGaN active layer 57, the crystal growth is further continued to form a p-type AlGaN layer 58. The p-type AlGaN layer 58 is a nitride semiconductor layer containing the impurity at an extremely low concentration, and acts as a high resistance region formed thick at the top portion of the hexagonal pyramid shape for preventing the flow of a current in an upper layer portion. The impurity concentration of the p-type AlGaN layer 58 is set, for example, in a range of $10 \times 10^{18}/cm^3$ or less, to reduce the mobility to several $cm^2/Vs$. The p-type AlGaN layer 58 has an upper portion having an approximately triangular shape in cross-section, which portion is located over the upper layer portion 56t as the top portion, and has thin side surface portions located over the side surface portions 56s so as to cover the periphery of the InGaN active layer 57. Since the upper layer portion 56t is positioned under the p-type AlGaN layer 58 functioning as the high resistance region, a current flowing via the upper layer portion 56t is suppressed.

A p-type gallium nitride layer 59 is stacked on the p-type AlGaN layer 58. The p-type AlGaN layer 58 and the p-type gallium nitride layer 59 are each doped with an impurity such as magnesium. A p-electrode 60 is formed on the p-type gallium nitride layer 59 by vapor-depositing a metal material such as Ni/Pt/Au or Ni(Pd)/Pt/Au. An n-electrode 61 is formed in an opening portion 62 opened in the silicon oxide film 54 by vapor-depositing a metal material such as Ti/Al/Pt/Au.

In the nitride semiconductor device having such a structure according to an embodiment, the p-type AlGaN layer 58 functioning as the high resistance region is formed on the InGaN active layer 57, wherein the p-type AlGaN layer 58 functions to suppress a current flowing to the n-type gallium nitride layer 56 via the upper layer portion 56t and to allow the flow of the current in the n-type gallium nitride layer 56 mainly via the side surface portions 56s. Accordingly, the current is efficiently injected to the active layer of the side surface portions 56s more than to the top portion side, to obtain a light emitting diode high in luminous efficiency with less leaked current.

According to an embodiment, the opening portion 55 formed in the silicon oxide film 54 is configured to have a nearly normal hexagonal shape; however, the present invention is not limited thereto. For example, the shape of the opening portion 55 may be another polygonal shape or a circular shape. Even in this case, a crystal growth layer having a hexagonal pyramid shape similar to that described above can be formed from the opening portion 55 by adjusting a growth condition. The tilt side surface of the crystal growth layer is not limited to the S-plane but may be the {1,1,-2,2} plane. Even in this case, like the above-described light emitting device obtained using the S-planes, a light emitting device obtained using the {1,1,-2,2} planes can suppress the leaked current.

Figure 5:
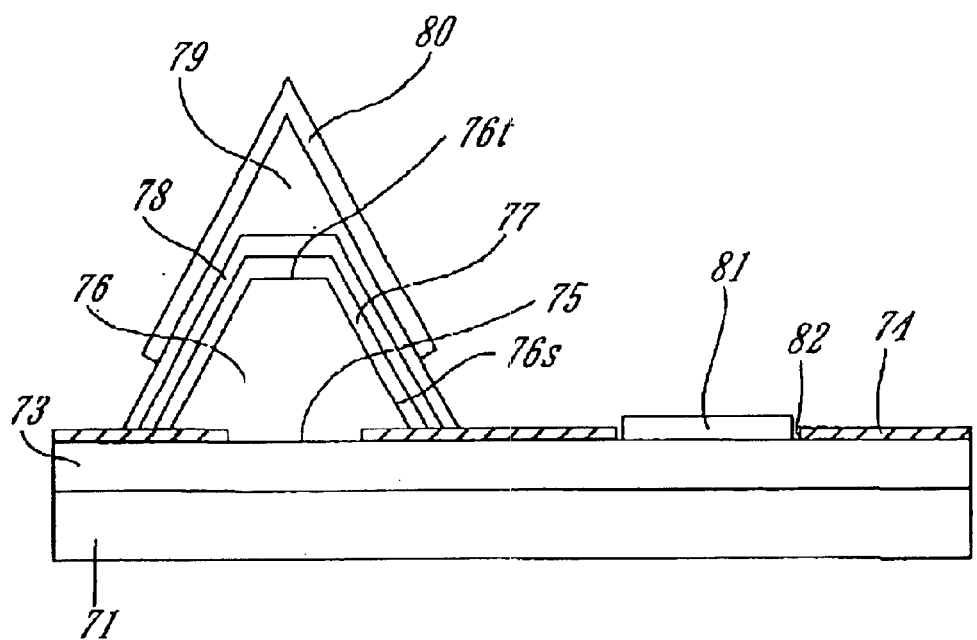
FIG. 5 is a sectional view of a semiconductor light emitting device according to an embodiment of the present invention.

According to an embodiment, as shown in FIG. 5, a high resistance region is formed on an active layer by using a p-type nitride semiconductor layer similar to that as described above. A light emitting device in an embodiment is the same as that described above in terms of formation of a hexagonal pyramid shaped nitride semiconductor light emitting device structure but is different therefrom in terms of the internal structure of the nitride semiconductor light emitting device structure.

FIG. 5 is a sectional view showing an inner configuration of a nitride semiconductor light emitting device structure according to an embodiment, with a p-electrode and an n-electrode formed thereto. An n-type gallium nitride layer 73 having a stacked structure of an undoped GaN layer and a silicon-doped GaN layer stacked thereon is formed on a sapphire substrate 71, and a silicon oxide film 74 is formed to cover the gallium nitride layer 73. Opening portions 75, each having a nearly normal hexagonal shape, are formed in the silicon oxide film 74, and an n-type GaN layer 76 is formed by selective growth from each of the opening portions 75. The sapphire substrate 71 is a substrate using the C-plane of sapphire as the principal plane, and one side of the normal hexagonal opening portion 75 is set to be in parallel to the [1,1,-2,0] direction. The silicon-doped n-type gallium nitride layer 76 is thus formed by selective growth using the opening portion 75.

The n-type gallium nitride layer 76 is formed by making a mixed gas of $H_2$ and $N_2$ as a carrier gas flow in a reaction chamber. The n-type gallium nitride layer 76 is doped with silicon as an impurity. The growth of the n-type gallium nitride layer 76 is stopped before the gallium nitride layer 76 becomes a perfect hexagonal pyramid shape. At such a stopped point of time, by switching the gas into a gas containing TMI (trimethyl indium) or TEI (triethyl indium), an InGaN active layer 77 is formed in such a manner as to cover an upper layer portion 76t and side surface portions 76s of the n-type gallium nitride layer 76.

After formation of the InGaN active layer 77, the crystal growth is further continued to form a p-type AlGaN layer 78 and a p-type gallium nitride 79. The p-type gallium nitride layer 79 is a nitride semiconductor layer containing the impurity at an extremely low concentration, and acts as a high resistance region formed thick at the top portion of the hexagonal pyramid shape for preventing the flow of a current in an upper layer portion. The p-type gallium nitride layer 79 has a thick upper portion having an approximately triangular shape in cross-section, which portion is located over the upper layer portion 76t as the top portion, and has thin side surface portions located over the side surface portions 76s so as to cover the periphery of the p-type AlGaN layer 78. Since the upper layer portion 76t is positioned under the p-type gallium nitride layer 79 functioning as the high resistance region, a current flowing via the upper layer portion 76t is suppressed. The p-type AlGaN layer 78 and the p-type gallium nitride layer 79 are each doped with an impurity such as magnesium.

A p-electrode 80 is formed on the p-type gallium nitride layer 79 by vapor-depositing a metal material such as Ni/Pt/Au or Ni(Pd)/Pt/Au. An n-electrode 81 is formed in an opening portion 82 opened in the silicon oxide film 74 by vapor-depositing a metal material such as Ti/Al/Pt/Au.

In the nitride semiconductor device having such a structure according to this embodiment, the p-type gallium nitride layer 79 functioning as the high resistance region is formed on the p-type AlGaN layer 78, wherein the p-type gallium nitride layer 79 functions to suppress a current flowing to the n-type gallium nitride layer 76 via the upper layer portion 76t and to allow the flow of the current in the n-type gallium nitride layer 76 mainly via the side surface portions 76s. Accordingly, the current is efficiently injected to the side surface portions 76s more than to the top portion side, to obtain a light emitting diode high in luminous efficiency with less leaked current.

According to an embodiment, the opening portion 75 formed in the silicon oxide film 74 is configured to have a nearly normal hexagonal shape; however, the present invention is not limited thereto. For example, the shape of the opening portion 75 may be another polygonal shape or a circular shape. Even in this case, a crystal growth layer having a hexagonal pyramid shape similar to that described above can be formed from the opening portion 75 by adjusting a growth condition. The tilt side surface of the crystal growth layer is not limited to the S-plane but may be the {1,1,-2,2} plane. Even in this case, like the above-described light emitting device obtained using the S-planes, a light emitting device obtained using the {1,1,-2,2} planes can suppress the leaked current.

Figure 6:
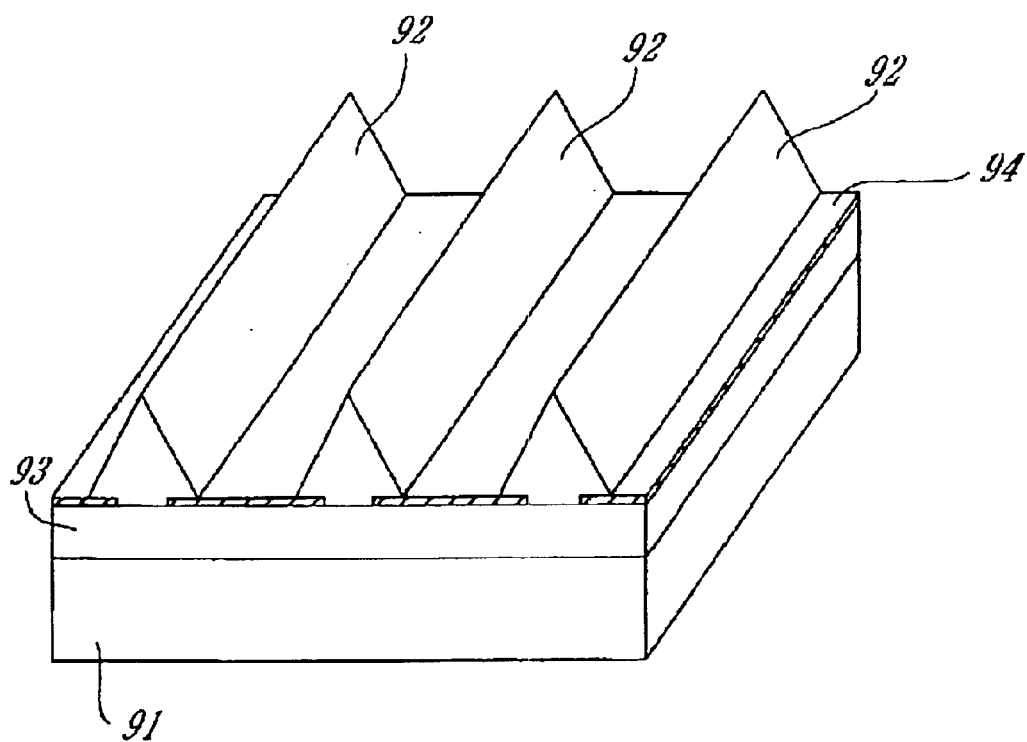
FIG. 6 is a perspective sectional view of a semiconductor light emitting device according to an embodiment of the present invention.

According to an embodiment, as shown in FIG. 6, a stripe shaped nitride semiconductor light emitting device structure 92, which has a triangular shape as a three-dimensional shape in cross-section, is formed on a sapphire substrate 91 by selective growth, and an electrode is formed on a portion of the stripe shaped nitride semiconductor light emitting device structure 92 having the triangular shape in cross-section, whereby the nitride semiconductor light emitting device structure 92 functions as a light emitting diode. A gallium nitride layer 93, which has a stacked structure of an undoped GaN layer and a silicon-doped GaN layer stacked thereon, is formed on the sapphire substrate 91, and a silicon oxide film 94 is formed to cover the gallium nitride layer 93. The silicon oxide film 94 functions as an anti-growth film at the time of selective growth. The stripe shaped nitride semiconductor light emitting device structure 92 having the triangular shape in cross-section is formed by selective growth from an opening portion formed in the silicon oxide film 94.

The stripe shaped nitride semiconductor light emitting device structure 92 having the triangular shape in cross-section can be formed in accordance with the steps similar to those for forming the nitride semiconductor light emitting device structure 12 in the first embodiment. In this case, the opening portion having a stripe shape may be formed in the silicon oxide film 94, and crystal growth may be performed by selective growth from the opening portion. The internal configuration of the nitride semiconductor light emitting device structure 92 may be the same as that shown in each of FIGS. 2 to 5.

Figure 7:
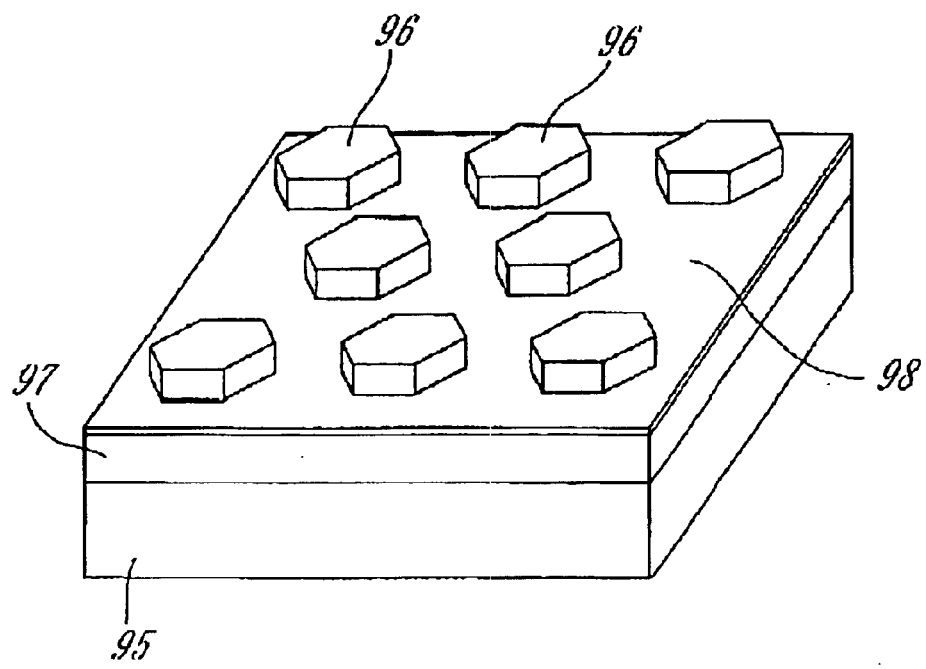
FIG. 7 is a perspective sectional view of a semiconductor light emitting device according to an embodiment of the present invention.

According to an embodiment, as shown in FIG. 7, a nitride semiconductor light emitting device structure 96 having a hexagonal column shape as a three-dimensional shape is formed on a sapphire substrate 95 by selective growth, and an electrode is formed on a portion of the hexagonal column shaped nitride semiconductor light emitting device structure 96, whereby the nitride semiconductor light emitting device structure 96 functions as a light emitting diode. A gallium nitride layer 97, which has a stacked structure of an undoped GaN layer and a silicon-doped GaN layer stacked thereon, is formed on the sapphire substrate 95, and a silicon oxide film 98 is formed to cover the gallium nitride layer 97. The silicon oxide film 98 functions as an anti-growth film at the time of selective growth. The hexagonal column shaped nitride semiconductor light emitting device structure 96 is formed by selective growth from an opening portion formed in the silicon oxide film 98. One side of the opening portion is set to be in parallel to the [1,1,-2,0] direction, and the hexagonal column shaped nitride semiconductor light emitting device structure 96 having {1,-1,0,0} planes as side surfaces is formed by selective growth from the opening portion by adjusting a growth condition.

Figure 8:
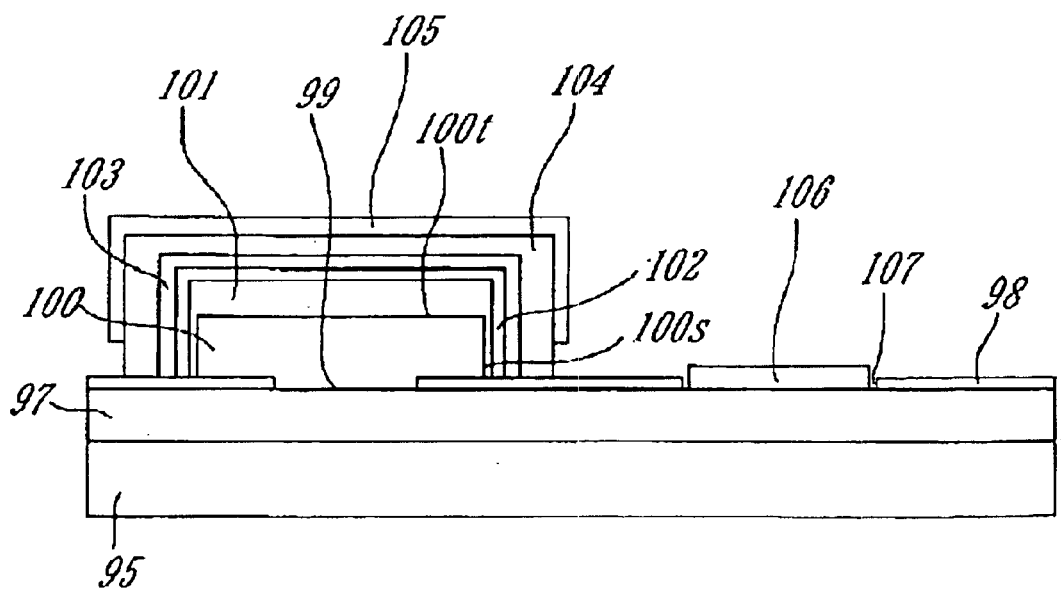
FIG. 8 is a sectional view of a semiconductor light emitting device according to an embodiment of the present invention.

FIG. 8 is a sectional view showing an inner configuration of the hexagonal column shaped nitride semiconductor light emitting device structure 96, with a p-electrode and an n-electrode formed thereto. The n-type gallium nitride layer 96 having the stacked structure of the undoped GaN layer and the silicon-doped GaN layer stacked thereon is formed on the sapphire substrate 95, and the silicon oxide film 98 is formed to cover the gallium nitride layer 96. Opening portions 99, each having a nearly normal hexagonal shape, are formed in the silicon oxide film 98, and an n-type GaN layer 100 is formed by selective growth from each of the opening portions 99. The sapphire substrate 95 is a substrate using the C-plane of sapphire as the principal plane, and one side of the normal hexagonal opening portion 99 is set to be in parallel to the [1,1,-2,0] direction. The silicon-doped n-type gallium nitride layer 100 is thus formed by selective growth using the opening portion 99.

The n-type gallium nitride layer 100 is formed by making a mixed gas of $H_2$ and $N_2$ as a carrier gas flow in a reaction chamber and supplying ammonia ($NH_3$) as an N source and trimethyl gallium (TMGa, $Ga(CH_3)_3$) as a Ga source. The n-type gallium nitride layer 100 is doped with silicon as an impurity. Although the n-type gallium nitride layer 100 is growing into a hexagonal column shape, the supply of the impurity gas is stopped halfway of the growth, so that an undoped gallium nitride layer 101 is grown after stopping of the supply of the impurity gas. In this case, since the switching of the impurity gas by stopping the supply thereof is continuously performed in the same reaction chamber, it does not inhibit the productivity. The undoped gallium nitride layer 101, which is a nitride semiconductor layer containing the impurity at an extremely low concentration, acts as a high resistance region for preventing the flow of a current in an upper layer portion.

The switching of the growth layer by stopping the impurity gas stops the growth of the n-type gallium nitride layer 100, with a result that the undoped gallium nitride 101 is grown to the shape thick on an upper layer portion 100t and thin on side surface portions 100s of the n-type gallium nitride layer 100. Since the upper layer portion 100t of the n-type gallium nitride layer 100 is continuous to the undoped gallium nitride layer 101 functioning as the high resistance region, a current flowing via the upper layer portion 100t is suppressed, with a result that a current flowing in an active layer, which is to be formed on the undoped gallium nitride layer 101, is also suppressed.

An InGaN active layer 102 containing indium is formed on the undoped gallium nitride layer 101, and a p-type AlGaN layer 103 and a p-type gallium nitride layer 104 are stacked thereon. The p-type AlGaN layer 103 and the p-type gallium nitride layer 104 are each doped with magnesium as an impurity. A p-electrode 105 is formed on the p-type gallium nitride layer 104 by vapor-depositing a metal material such as Ni/Pt/Au or Ni(Pd)/Pt/Au. An n-electrode 106 is formed in an opening portion 107 opened in the silicon oxide film 98 by vapor-depositing a metal material such as Ti/Al/Pt/Au.

In the nitride semiconductor device having such a structure according to an embodiment, the undoped gallium nitride layer 101 functioning as the high resistance region is formed under the InGaN active layer 102, wherein the undoped gallium nitride layer 101 functions to suppress a current flowing to the n-type gallium nitride layer 100 via the upper layer portion loot and to allow the flow of the current in the n-type gallium nitride layer 100 mainly via the side surface portions 100s. Accordingly, the current is efficiently injected to the side surface portions 100s more than to the top portion side, to obtain a light emitting diode high in luminous efficiency with less leaked current.

Figure 9:
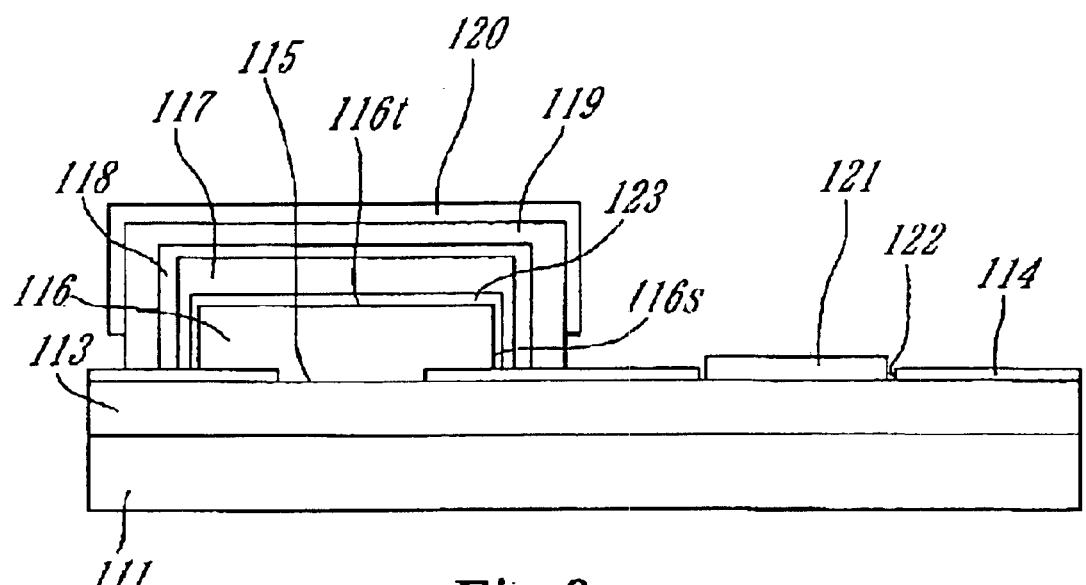
FIG. 9 is a sectional view of a semiconductor light emitting device according to an embodiment of the present invention.

According to an embodiment, as shown in FIG. 9, a high resistance region is formed on an active layer. A light emitting device in an embodiment is the same as that discussed above in terms of formation of a hexagonal column shaped nitride semiconductor light emitting device structure, but is different therefrom in terms of the internal structure of the nitride semiconductor light emitting device structure.

FIG. 9 is a sectional view showing an inner configuration of a nitride semiconductor light emitting device structure according to an embodiment, with a p-electrode and an n-electrode formed thereto. An n-type gallium nitride layer 113 having a stacked structure of an undoped GaN layer and a silicon-doped GaN layer stacked thereon is formed on a sapphire substrate 111, and a silicon oxide film 114 is formed to cover the gallium nitride layer 113. Opening portions 115, each having a nearly normal hexagonal shape, are formed in the silicon oxide film 114, and an n-type GaN layer 116 is formed by selective growth from each of the opening portions 115. The sapphire substrate 111 is a substrate using the C-plane of sapphire as the principal plane, and one side of the normal hexagonal opening portion 115 is set to be in parallel to the [1,1,-2,0] direction. The silicon-doped n-type gallium nitride layer 116 is thus formed by selective growth using the opening portion 115.

The n-type gallium nitride layer 116 is formed by making a mixed gas of $H_2$ and $N_2$ as a carrier gas flow in a reaction chamber. The n-type gallium nitride layer 116 is doped with silicon as an impurity. After formation of the n-type gallium nitride layer 116, an InGaN active layer 123 is formed in such a manner as to cover an upper layer portion 116t and side surface portions 116s of the n-type gallium nitride layer 116.

After formation of the InGaN active layer 123, the crystal growth is continued to form an undoped gallium nitride layer 117. The undoped gallium nitride layer 117 is a nitride semiconductor layer containing the impurity at an extremely low concentration, and acts as a high resistance region for preventing the flow of a current in an upper layer portion. The undoped gallium nitride layer 117 has a thick upper portion located on the upper layer portion 116t as the top portion, and has thin side surface portions located over the side surface portions 116s so as to cover the periphery of the InGaN active layer 123. Since the upper layer portion 116t is continuous to the undoped gallium nitride layer 117 functioning as the high resistance region via the InGaN active layer 123, a current flowing in the InGaN active layer 123, which is formed under the undoped gallium nitride layer 117 and on the upper layer portion 116t, is suppressed.

A p-type AlGaN layer 118 and a p-type gallium nitride layer 119 are stacked on the undoped gallium nitride layer 117. The p-type AlGaN layer 118 and the p-type gallium nitride layer 119 are each doped with an impurity such as magnesium. A p-electrode 120 is formed on the p-type gallium nitride layer 119 by vapor-depositing a metal material such as Ni/Pt/Au or Ni(Pd)/Pt/Au. An n-electrode 121 is formed in an opening portion 122 opened in the silicon oxide film 114 by vapor-depositing a metal material such as Ti/Al/Pt/Au.

In the nitride semiconductor device having such a structure according to this embodiment, the undoped gallium nitride layer 117 functioning as the high resistance region is formed on the InGaN active layer 123, wherein the undoped gallium nitride layer 117 functions to suppress a current flowing to the n-type gallium nitride layer 116 via the upper layer portion 116t and to allow the flow of the current in the n-type gallium nitride layer 116 mainly via the side surface portions 116s. Accordingly, the current is efficiently injected to the side surface portions 116s more than to the top portion side, to obtain a light emitting diode high in luminous efficiency with less leaked current.

According to an embodiment, the opening portion 115 formed in the silicon oxide film 114 is configured to have a nearly normal hexagonal shape; however, the present invention is not limited thereto. For example, the shape of the opening portion 115 may be another polygonal shape or a circular shape. Even in this case, a crystal growth layer having a hexagonal column shape similar to that described above can be formed from the opening portion 115 by adjusting a growth condition.

Figure 10:
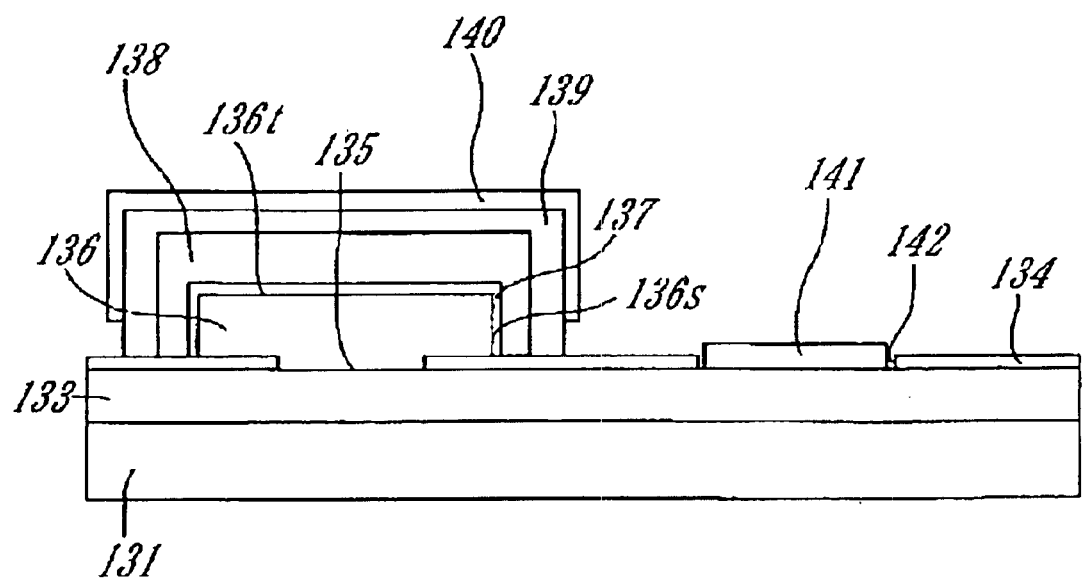
FIG. 10 is a sectional view of a semiconductor light emitting device according to an embodiment of the present invention.

According to an embodiment, as shown in FIG. 10, a high resistance region is formed on an active layer by using a p-type nitride semiconductor layer. A light emitting device in an embodiment is the same as discussed above in terms of formation of a hexagonal column shaped nitride semiconductor light emitting device structure but is different therefrom in terms of the internal structure of the nitride semiconductor light emitting device structure.

FIG. 10 is a sectional view showing an inner configuration of a nitride semiconductor light emitting device structure according to an embodiment, with a p-electrode and an n-electrode formed thereto. An n-type gallium nitride layer 133 having a stacked structure of an undoped GaN layer and a silicon-doped GaN layer stacked thereon is formed on a sapphire substrate 131, and a silicon oxide film 134 is formed to cover the gallium nitride layer 133. Opening portions 135, each having a nearly normal hexagonal shape, are formed in the silicon oxide film 134, and an n-type GaN layer 136 is formed by selective growth from each of the opening portions 135. The sapphire substrate 131 is a substrate using the C-plane of sapphire as the principal plane, and one side of the normal hexagonal opening portion 135 is set to be in parallel to the [1,1,−2,0] direction. The silicon-doped n-type gallium nitride layer 136 is thus formed by selective growth using the opening portion 135.

The n-type gallium nitride layer 136 is formed by making a mixed gas of $H_2$ and $N_2$ as a carrier gas flow in a reaction chamber. The n-type gallium nitride layer 136 is doped with silicon as an impurity. After formation of the hexagonal column shaped n-type gallium nitride layer 136, the gas is switched to a gas containing TMI (trimethyl indium) or TEI (triethyl indium), to form an InGaN active layer 137. The InGaN layer 137 is formed in such a manner as to cover an upper layer portion 136t and side surface portions 136s of the n-type gallium nitride layer 136.

After formation of the InGaN active layer 137, the crystal growth is further continued to form a p-type AlGaN layer 138. The p-type AlGaN layer 138 is a nitride semiconductor layer containing the impurity at an extremely low concentration, and acts as a high resistance region formed thick at the upper surface portion of the hexagonal column shape for preventing the flow of a current in an upper layer portion 136t. The impurity concentration of the p-type AlGaN layer 138 is set, for example, in a range of $10\times10^{18}/cm^3$ or less, to reduce the mobility to several $cm^2/Vs$. The p-type AlGaN layer 138 has a relatively thick upper portion located over the upper layer portion 136t as the upper surface portion, and has thin side surface portions located over the side surface portions 136s so as to cover the periphery of the InGaN active layer 137. Since the upper layer portion 136t is positioned under the p-type AlGaN layer 138 functioning as the high resistance region, a current flowing via the upper layer portion 136t is suppressed.

A p-type gallium nitride layer 139 is stacked on the p-type AlGaN layer 138. The p-type AlGaN layer 138 and the p-type gallium nitride layer 139 are each doped with an impurity such as magnesium. A p-electrode 140 is formed on the p-type gallium nitride layer 139 by vapor-depositing a metal material such as Ni/Pt/Au or Ni(Pd)/Pt/Au. An n-electrode 141 is formed in an opening portion 142 opened in the silicon oxide film 134 by vapor-depositing a metal material such as Ti/Al/Pt/Au.

In the nitride semiconductor device having such a structure according to an embodiment, the p-type AlGaN layer 138 functioning as the high resistance region is formed on the InGaN active layer 137, wherein the p-type AlGaN layer 138 functions to suppress a current flowing to the n-type gallium nitride layer 136 via the upper layer portion 136t and to allow the flow of the current in the n-type gallium nitride layer 136 mainly via the side surface portions 136s. Accordingly, the current is efficiently injected to the active layer via the side surface portions 136s more than via the top portion side, to obtain a light emitting diode high in luminous efficiency with less leaked current.

According to an embodiment, the opening portion 135 formed in the silicon oxide film 134 is configured to have a nearly normal hexagonal shape; however, the present invention is not limited thereto. For example, the shape of the opening portion 135 may be another polygonal shape or a circular shape. Even in this case, a crystal growth layer having a hexagonal column shape similar to that described above can be formed from the opening portion 135 by adjusting the growth condition.

Figure 11:
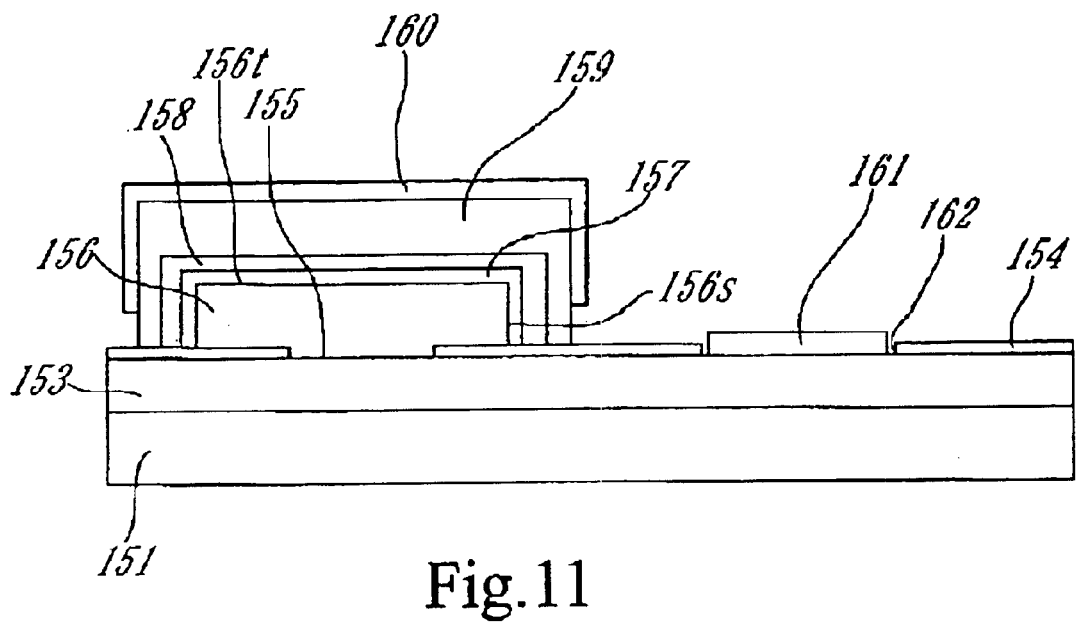
FIG. 11 is a sectional view of a semiconductor light emitting device according to an embodiment of the present invention.

According to an embodiment, as shown in FIG. 11, a high resistance region is formed on an active layer by using a p-type-nitride semiconductor layer similar to that described in the eighth embodiment. A light emitting device in an embodiment is the same as that in the first embodiment in terms of formation of a hexagonal pyramid shaped nitride semiconductor light emitting device structure but is different therefrom in terms of the internal structure of the nitride semiconductor light emitting device structure.

FIG. 11 is a sectional view showing an inner configuration of a nitride semiconductor light emitting device structure according to an embodiment, with a p-electrode and an n-electrode formed thereto. An n-type gallium nitride layer 153 having a stacked structure of an undoped GaN layer and a silicon-doped GaN layer stacked thereon is formed on a sapphire substrate 151, and a silicon oxide film 154 is formed to cover the gallium nitride layer 153. Opening portions 155, each having a nearly normal hexagonal shape, are formed in the silicon oxide film 154, and an n-type GaN layer 156 is formed by selective growth from each of the opening portions 155. The sapphire substrate 151 is a substrate using the C-plane of sapphire as the principal plane, and one side of the normal hexagonal opening portion 155 is set to be in parallel to the [1,1,−2,0] direction. The silicon-doped n-type gallium nitride layer 156 is thus formed by selective growth using the opening portion 155.

The n-type gallium nitride layer 156 is formed by making a mixed gas of $H_2$ and $N_2$ as a carrier gas flow in a reaction chamber. The n-type gallium nitride layer 156 is doped with silicon as an impurity. After the n-type gallium nitride layer 156 having a hexagonal column shape is formed, the gas is switched to another gas, to form an InGaN active layer 157. The InGaN active layer 157 is formed to cover an upper layer portion 156t and side surface portions 156s of the n-type gallium nitride layer 156.

After formation of the InGaN active layer 157, the crystal growth is further continued to form a p-type AlGaN layer 158 and a p-type gallium nitride 159. The p-type gallium nitride layer 159 is a nitride semiconductor layer containing the impurity at an extremely low concentration, and acts as a high resistance region formed thick at the upper surface portion of the hexagonal column shape for preventing the flow of a current in an upper layer portion. The p-type gallium nitride layer 159 has a thick upper portion located on the upper layer portion 156t, and has thin side surface portions located on the side surface portions 156s in such a manner as to cover the periphery of the p-type AlGaN layer 158. Since the upper layer portion 156t is positioned under the thick portion of the p-type gallium nitride layer 159 functioning as the high resistance region, a current flowing via the upper layer portion 156t is suppressed. The p-type AlGaN layer 158 and the p-type gallium nitride layer 159 are each doped with an impurity such as magnesium.

A p-electrode 160 is formed on the p-type gallium nitride layer 159 by vapor-depositing a metal material such as Ni/Pt/Au or Ni(Pd)/Pt/Au. An n-electrode 161 is formed in an opening portion 162 opened in the silicon oxide film 154 by vapor-depositing a metal material such as Ti/Al/Pt/Au.

In the nitride semiconductor device having such a structure according to this embodiment, the p-type gallium nitride layer 159 functioning as the high resistance region is formed on the p-type AlGaN layer 158, wherein the p-type gallium nitride layer 159 functions to suppress a current flowing to the n-type gallium nitride layer 156 via the upper layer portion 156t and to allow the flow of the current in the n-type gallium nitride layer 156 mainly via the side surface portions 156s. Accordingly, the current is efficiently injected to the active layer via the side surface portions 156s more than via the upper surface portion side, to obtain a light emitting diode high in luminous efficiency with less leaked current.

According to an embodiment, the opening portion 155 formed in the silicon oxide film 154 is configured to have a nearly normal hexagonal shape; however, the present invention is not limited thereto. For example, the shape of the opening portion 155 may be another polygonal shape or a circular shape. Even in this case, a crystal growth layer having a hexagonal column shape similar to that described above can be formed from the opening portion 155 by adjusting a growth condition.

Figure 12:
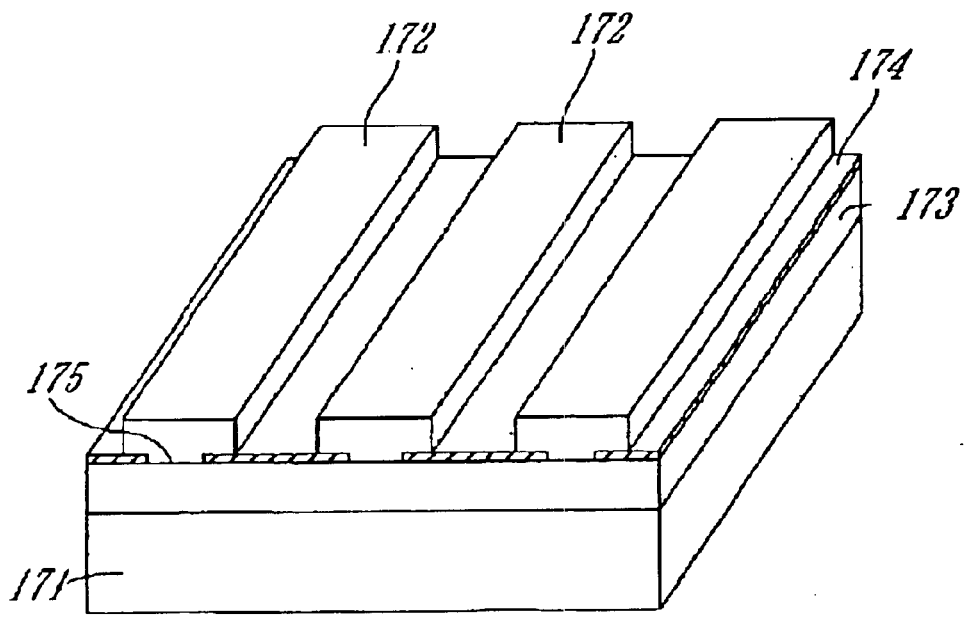
FIG. 12 is a perspective sectional view of a semiconductor light emitting device according to an embodiment of the present invention.

According to an embodiment, as shown in FIG. 12, a stripe shaped nitride semiconductor light emitting device structure 172 having a rectangular shape in cross-section is formed on a sapphire substrate 171 by selective growth, and an electrode is formed on a portion of the stripe shaped nitride semiconductor light emitting device structure 172 having the rectangular shape in cross-section, whereby the nitride semiconductor light emitting device structure 172 functions as a light emitting diode. A gallium nitride layer 173, which has a stacked structure of an undoped GaN layer and a silicon-doped GaN layer stacked thereon, is formed on the sapphire substrate 171 and a silicon oxide film 174 is formed to cover the gallium nitride layer 173. The silicon oxide film 174 functions as an anti-growth film at the time of selective growth. The stripe shaped nitride semiconductor light emitting device structure 172 having the rectangular shape in cross-section is formed by selective growth from an opening portion 175 formed in the silicon oxide film 174.

The stripe shaped nitride semiconductor light emitting device structure 172 having the rectangular shape in cross-section can be formed in accordance with steps similar to those for forming the nitride semiconductor light emitting device structure 96 in the sixth embodiment. In this case, the opening portion having a stripe shape may be formed in the silicon oxide film 174, and crystal growth may be performed by selective growth from the opening portion. The internal configuration of the nitride semiconductor light emitting device structure 172 may be the same as that shown in each of FIGS. 8 to 11.

Figure 13:
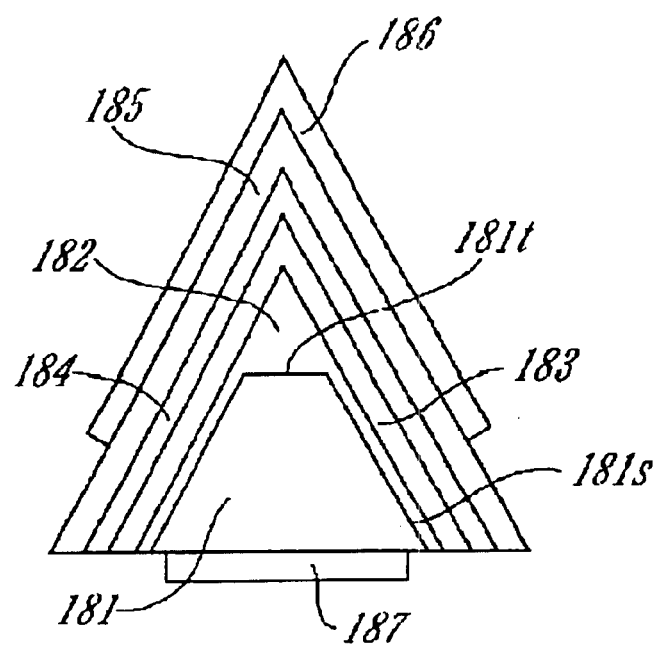
FIG. 13 is a sectional view of a semiconductor light emitting device according to an embodiment of the present invention.

According to an embodiment, as shown in FIG. 13, a crystal layer is peeled from a substrate, and a transparent electrode is formed on the back surface of the crystal layer. An n-type gallium nitride layer 181 having a hexagonal pyramid shape with no peak portion is formed, wherein tilt planes composed of S-planes are taken as side surface portions 181s and an upper portion composed of the C-plane is taken as an upper layer portion 181t. The n-type gallium nitride layer 181 having the side surface portions 181s and the upper layer portion 181t is covered with an undoped gallium nitride layer 182.

The growth of the n-type gallium nitride layer 181 is stopped before the gallium nitride layer 181 becomes a perfect hexagonal pyramid shape. By stopping the supply of the impurity gas at that time, an undoped gallium nitride layer 182 is grown. Since the switching of the impurity gas by stopping the supply thereof is continuously performed in the same reaction chamber, it does not inhibit the productivity. The undoped gallium nitride layer 182, which is a nitride semiconductor layer containing the impurity at an extremely low concentration, acts as a high resistance region for preventing the flow of a current in an upper layer portion.

The n-type gallium nitride layer 181 is formed into the hexagonal pyramid shape with no peak portion, wherein the upper surface portion with no peak portion is taken as the upper layer portion 181t and the S-planes of the tilted crystal layer are taken as the side surface portions 181s. The undoped gallium nitride layer 182 has an upper portion having an approximately triangular shape in cross-section, which portion is located on the upper layer portion 181t as the top portion, and has thin side surface portions located on the side surface portions 181s so as to cover the peripheries of the side surface portions 181s. Since the upper layer portion 181t of the n-type gallium nitride layer 181 is continuous to the undoped gallium nitride layer 182 functioning as the high resistance region, a current flowing via the upper layer portion 181t is suppressed, with a result that a current flowing in an active layer, which is to be formed on the undoped gallium nitride layer 182, is also suppressed.

An InGaN active layer 183 containing indium is formed on the undoped gallium nitride layer 182, and a p-type AlGaN layer 184 and a p-type gallium nitride layer 185 are stacked thereon. The p-type AlGaN layer 184 and the p-type gallium nitride layer 185 are each doped with magnesium as an impurity. A p-electrode 186 is formed on the p-type gallium nitride layer 185 by vapor-depositing a metal material such as Ni/Pt/Au or Ni(Pd)/Pt/Au. An n-electrode 187 is, according to an embodiment, configured as a transparent n-electrode such as an ITO film formed on the back surface of the n-type gallium nitride layer 181 after the growth substrate is peeled therefrom by laser abrasion or the like.

In the nitride semiconductor device having such a structure according to an embodiment, the undoped gallium nitride layer 182 functioning as the high resistance region is formed under the InGaN active layer 183, wherein the undoped gallium nitride layer 182 functions to suppress a current flowing to the n-type gallium nitride layer 181 via the upper layer portion 181t and to allow the flow of the current in the n-type gallium nitride layer 181 mainly via the side surface portions 181s. Accordingly, the current is efficiently injected to the side surface portions 181s more than to the top portion side, to obtain a light emitting diode high in luminous efficiency with less leaked current.

The tilt side surface is not limited to the S-plane but may be the {1,1,-2,2} plane. Even in this case, a light emitting device capable of suppressing a leaked current can be formed. The n-type gallium nitride layer 181 or the like is formed into the hexagonal pyramid shape in an embodiment; however, it may be formed into a stripe shape which has a triangular shape in cross-section. The configuration of providing the transparent n-electrode 187 is effective for emergence of light from the side provided with the transparent n-electrode 187, and therefore, if a crystal layer extending in a stripe shape is used as an active layer of a semiconductor laser for emergence of light in the direction parallel to the stripe shape, an electrode other than the transparent electrode may be formed.

Figure 14:
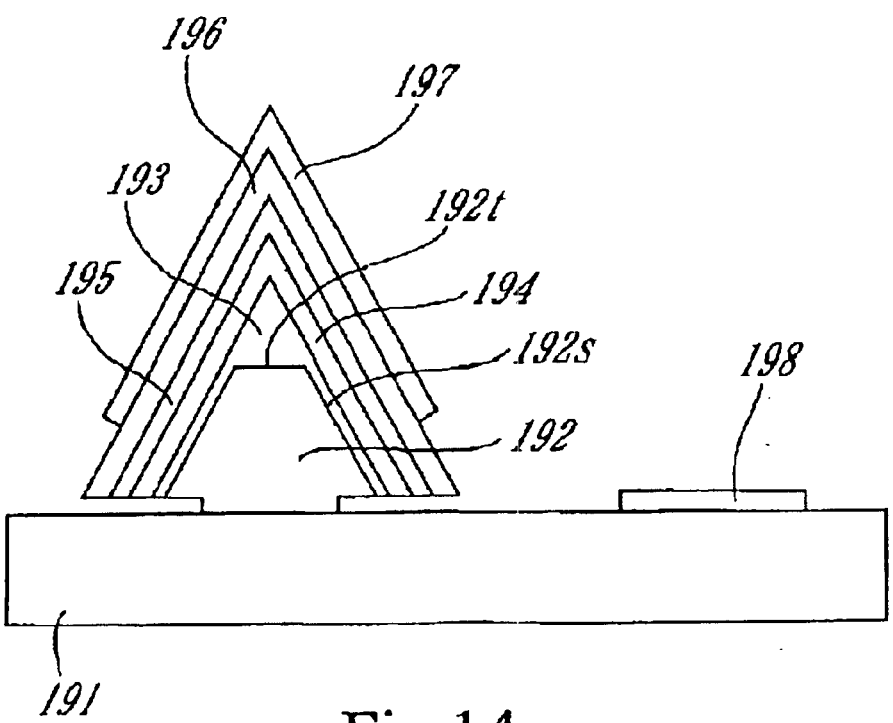
FIG. 14 is a sectional view of a semiconductor light emitting device according to an embodiment of the present invention.

According to an embodiment, as shown in FIG. 14, a growth substrate is configured as a conductive substrate, which is exemplified by an n-type silicon carbide substrate 191. An n-type gallium nitride layer 192 containing an impurity such as silicon is formed on the n-type silicon carbide substrate 191. The back surface of the n-type gallium nitride layer 192 is connected to the n-type silicon carbide substrate 191, and the n-type gallium nitride layer 192 is formed into a three-dimensional shape such as a hexagonal pyramid shape by selective growth or the like.

With respect to the n-type gallium nitride layer 192 having the hexagonal pyramid shape with no peak portion, the tilt planes composed of the S-planes thereof are taken as side surface portions 192s and the upper surface composed of the C-plane thereof is taken as an upper layer portion 192t. The n-type gallium nitride layer 192 having the side surface portions 192s and the upper layer portion 192t is covered with an undoped gallium nitride layer 193.

The growth of the n-type gallium nitride layer 192 is stopped before the gallium nitride layer 192 becomes a perfect hexagonal pyramid shape. By stopping the supply of the impurity gas at that time, an undoped gallium nitride layer 193 is grown. Since the switching of the impurity gas by stopping the supply thereof is continuously performed in the same reaction chamber, it does not inhibit the productivity. The undoped gallium nitride layer 193, which is a nitride semiconductor layer containing the impurity at an extremely low concentration, acts as a high resistance region for preventing the flow of a current in an upper layer portion.

The n-type gallium nitride layer 192 is formed into the hexagonal pyramid shape with no peak portion, wherein the upper surface portion with no peak portion is taken as the upper layer portion 192t and the S-planes of the tilted crystal layer are taken as the side surface portions 192s. The undoped gallium nitride layer 193 has an upper portion having an approximately triangular shape in cross-section, which portion is located on the upper layer portion 192t as the top portion, and has thin side surface portions located on the side surface portions 192s so as to cover the peripheries of the side surface portions 192s. Since the upper layer portion 192t of the n-type gallium nitride layer 192 is continuous to the undoped gallium nitride layer 193 functioning as the high resistance region, a current flowing via the upper layer portion 192t is suppressed, with a result that a current flowing in an active layer, which is to be formed on the undoped gallium nitride layer 193, is also suppressed.

An InGaN active layer 194 containing indium is formed on the undoped gallium nitride layer 193, and a p-type AlGaN layer 195 and a p-type gallium nitride layer 196 are stacked thereon. The p-type AlGaN layer 195 and the p-type gallium nitride layer 196 are each doped with magnesium as an impurity. A p-electrode 197 is formed on the p-type gallium nitride layer 196 by vapor-depositing a metal material such as Ni/Pt/Au or Ni(Pd)/Pt/Au. An n-electrode 198 is, according to an embodiment, directly formed on the n-type silicon carbide substrate 191 as the conductive substrate by vapor-depositing a metal material such as Ti/Al/Pt/Au.

In the nitride semiconductor device having such a structure according to this embodiment, the undoped gallium nitride layer 193 functioning as the high resistance region is formed under the InGaN active layer 194, wherein the undoped gallium nitride layer 193 functions to suppress a current flowing to the n-type gallium nitride layer 192 via the upper layer portion 192t and to allow the flow of the current in the n-type gallium nitride layer 192 mainly via the side surface portions 192s. Accordingly, the current is efficiently injected to the side surface portions 192s more than to the top portion side, to obtain a light emitting diode high in luminous efficiency with less leaked current.

The tilt side surface is not limited to the S-plane but may be the {1,1,-2,2} plane. Even in this case, a light emitting device capable of suppressing a leaked current can be formed. The n-type gallium nitride layer 192 is formed into the hexagonal pyramid shape with no peak portion in an embodiment; however, it may be formed into a stripe shape which has a trapezoidal shape in cross-section.

Figure 15:
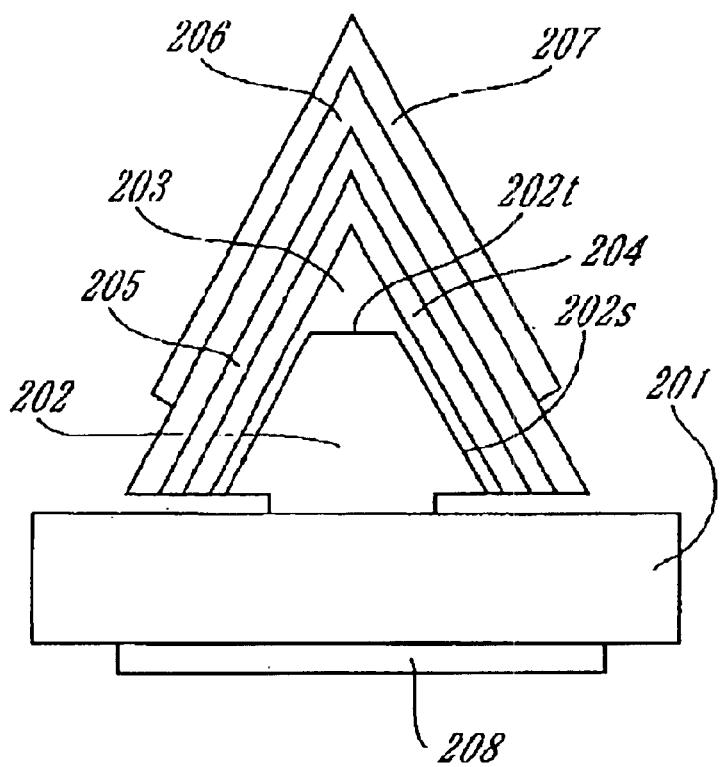
FIG. 15 is a sectional view of a semiconductor light emitting device according to an embodiment of the present invention.

A nitride semiconductor device according to this embodiment is modified from that discussed above, wherein the device, which has a hexagonal pyramid shape, is formed on an n-type silicon carbide substrate 201. To be more specific, as shown in FIG. 15, the nitride semiconductor device according to an embodiment has a structure that an n-type gallium nitride layer 202 is formed on the front surface of the n-type silicon carbide substrate 201 which has a transparent n-electrode 208 formed on the back surface thereof.

The n-type gallium nitride layer 202 is formed, by selective growth or the like, into a three-dimensional shape such as a hexagonal pyramid shape with no peak portion. With respect to the n-type gallium nitride layer 202, tilt planes composed of the S-planes thereof are taken as side surface portions 202s and an upper surface composed of the C-plane thereof is taken as an upper layer portion 202t. The n-type gallium nitride layer 202 having the side surface portions 202s and the upper layer portion 202t is covered with an undoped gallium nitride layer 203.

The growth of the n-type gallium nitride layer 202 is stopped before the gallium nitride layer 202 becomes a perfect hexagonal pyramid shape. By stopping the supply of the impurity gas at that time, an undoped gallium nitride layer 203 is grown. Since the switching of the impurity gas by stopping the supply thereof is continuously performed in the same reaction chamber, it does not inhibit the productivity. The undoped gallium nitride layer 203, which is a nitride semiconductor layer containing the impurity at an extremely low concentration, acts as a high resistance region for preventing the flow of a current in an upper layer portion. The undoped gallium nitride layer 203 has an upper portion having an approximately triangular shape in cross-section, which portion is located on the upper layer portion 202t as the top portion, and has thin side surface portions located on the side surface portions 202s so as to cover the peripheries of the side surface portions 202s. Since the upper layer portion 202t of the n-type gallium nitride layer 202 is continuous to the undoped gallium nitride layer 203 functioning as the high resistance region, a current flowing via the upper layer portion 202t is suppressed, with a result that a current flowing in an active layer, which is to be formed on the undoped gallium nitride layer 203, is also certainly suppressed in the vicinity of the top portion.

An InGaN active layer 204 containing indium is formed on the undoped gallium nitride layer 203, and a p-type AlGaN layer 205 and a p-type gallium nitride layer 206 are stacked thereon. The p-type AlGaN layer 205 and the p-type gallium nitride layer 206 are each doped with magnesium as an impurity. A p-electrode 207 is formed on the p-type gallium nitride layer 206 by vapor-depositing a metal material such as Ni/Pt/Au or Ni(Pd)/Pt/Au.

Even in the device having such a structure, a current is efficiently injected to the active layer on the side surface portions 202s more than on the upper surface side, to obtain a light emitting diode high in luminous efficiency with less leaked current. The n-type gallium nitride layer or the like is formed into a hexagonal pyramid shape in an embodiment; however, it may be formed into a stripe shape which has a triangular or trapezoidal shape in cross-section.

In a nitride semiconductor device according to this embodiment, a high resistance region is formed by using an undoped nitride semiconductor layer.

Figure 16:
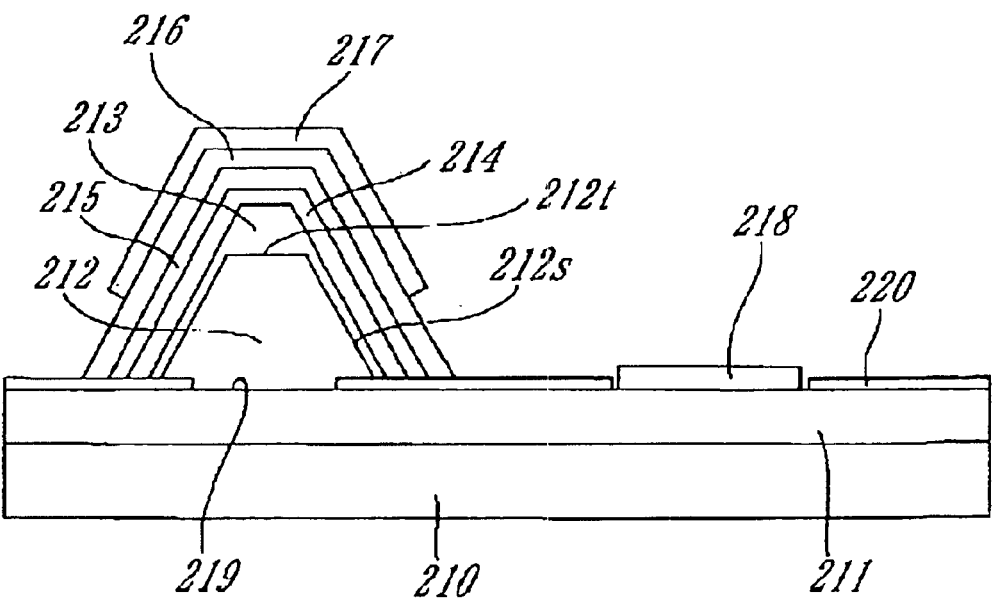
FIG. 16 is a sectional view of a semiconductor light emitting device according to an embodiment of the present invention.

FIG. 16 is a sectional view showing an inner configuration of a nitride semiconductor light emitting device structure according to an embodiment, with a p-electrode and an n-electrode formed thereto. An n-type gallium nitride layer 211 having a stacked structure of an undoped GaN layer and a silicon-doped GaN layer stacked thereon is formed on a sapphire substrate 210, and a silicon oxide film 220 is formed to cover the gallium nitride layer 211. Opening portions 219, each having a nearly normal hexagonal shape, are formed in the silicon oxide film 220, and an n-type GaN layer 212 is formed by selective growth from each of the opening portions 219. The sapphire substrate 210 is a substrate using the C-plane of sapphire as the principal plane, and one side of the normal hexagonal opening portion 219 is set to be in parallel to the [1,1,−2,0] direction. The silicon-doped n-type gallium nitride layer 212 is thus formed by selective growth using the opening portion 219.

The n-type gallium nitride layer 212 is formed, for example, into a hexagonal pyramid shape with no peak portion, wherein the S-planes are taken as tilt side surface portions 212s and the C-plane is taken as an upper layer portion 212t. After formation of the n-type gallium nitride layer 212, the gas is switched into another gas, to form an undoped gallium nitride layer 213.

Since the switching of the impurity gas by stopping the supply thereof is continuously performed in the same reaction chamber, it can maintain the productivity. The undoped gallium nitride layer 213, which is a nitride semiconductor layer containing the impurity at an extremely low concentration, acts as a high resistance region for preventing the flow of a current in an upper layer portion. The undoped gallium nitride layer 213 has a thick upper portion parallel to the C-plane, which portion is located on the upper layer portion 212t, and has thin side surface portions located on the side surface portions 212s so as to cover the peripheries of the side surface portions 212s. Since the upper layer portion 212t of the n-type gallium nitride layer 212 is continuous to the undoped gallium nitride layer 213 functioning as the high resistance region, a current flowing via the upper layer portion 212t is suppressed, with a result that a current flowing in an active layer 214, which is to be formed on the undoped gallium nitride layer 213, is also certainly suppressed on the upper layer portion 212t side.

An InGaN active layer 214 containing indium is formed on the undoped gallium nitride layer 213, and a p-type AlGaN layer 215 and a p-type gallium nitride layer 216 are stacked thereon. Each of the InGaN active layer 214, the p-type AlGaN layer 215, and the p-type gallium nitride layer 216 is formed into a shape having a facet structure which has the C-plane as a result of reflecting the C-plane of the upper layer portion 212t. A p-electrode 217 is formed on the p-type gallium nitride layer 216 by vapor-depositing a metal material such as Ni/Pt/Au or Ni(Pd)/Pt/Au. An n-electrode 218 is formed in an opening portion opened in the silicon oxide film 220 by vapor-depositing a metal material such as Ti/Al/Pt/Au.

Even in the device having such a structure, a current is efficiently injected to the active layer 214 on the side surface portion 212s side more than on the upper surface side, to obtain a light emitting diode high in luminous efficiency with less leaked current. The n-type gallium nitride layer or the like is formed into a hexagonal pyramid shape in an embodiment; however, it may be formed into a stripe shape which has a triangular or trapezoidal shape in cross-section.

In a nitride semiconductor device according to an embodiment, a silicon-doped n-type gallium nitride layer having a shape recessed at its central portion is formed, and an undoped nitride semiconductor layer having a shape thick at its central portion is used as a high resistance region.

Figure 17:
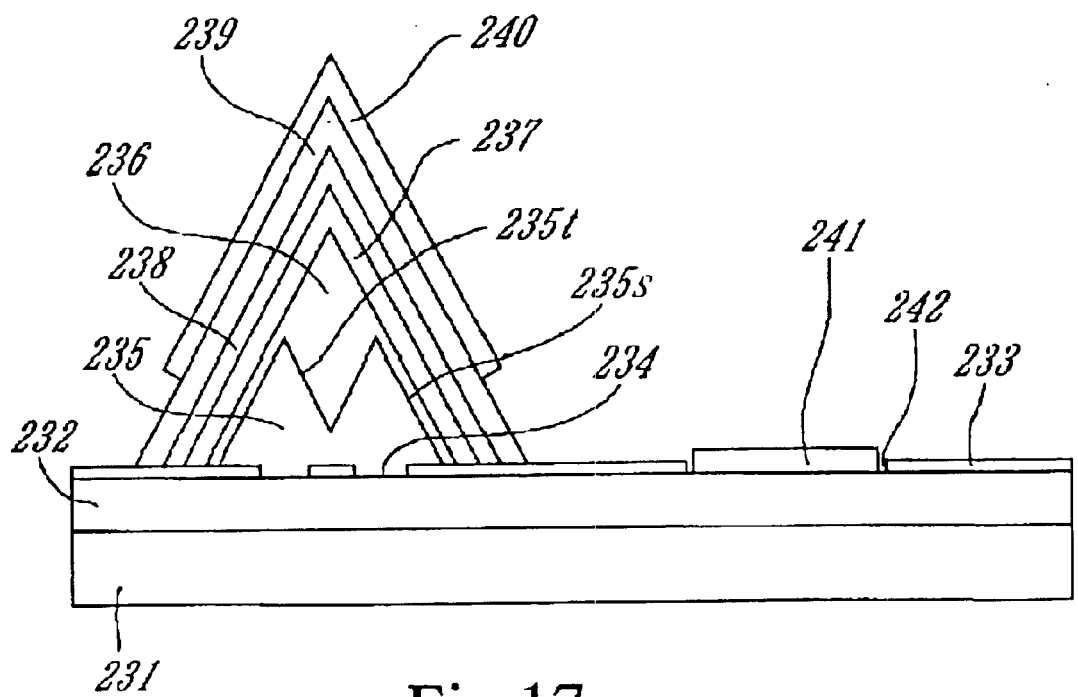
FIG. 17 is a sectional view of a semiconductor light emitting device according to an embodiment of the present invention.

FIG. 17 is a sectional view showing an inner configuration of a nitride semiconductor light emitting device according to an embodiment, with a p-electrode and an n-electrode formed thereto. An n-type gallium nitride layer 232 having a stacked structure of an undoped GaN layer and a silicon-doped GaN layer stacked thereon is formed on a sapphire substrate 231, and a silicon oxide film 233 is formed to cover the gallium nitride layer 232. Opening portions 234, each having a nearly hexagonal outer peripheral portion and an approximately normal hexagonal island-shaped anti-growth portion located at an inner central portion of the outer peripheral portion, are formed in the silicon oxide film 233, and an n-type GaN layer 235 is formed by selective growth from each of the opening portions 234. The sapphire substrate 231 is a substrate using the C-plane of sapphire as the principal plane. The silicon-doped n-type gallium nitride layer 235 is formed, by selective growth, into a shape which is recessed at its central portion as a result of reflecting the island-shaped anti-growth portion.

The n-type gallium nitride layer 235 has tilt planes composed of the S-planes and also has, at its central portion, a recessed portion recessed into an inverted hexagonal pyramid shape. In this way, the n-type gallium nitride layer 235 has tilt surface portions 235s composed of the S-planes and an upper layer portion 235t recessed at its central portion. After formation of the n-type gallium nitride layer 235, the gas is switched into another gas, to form an undoped gallium nitride layer 236. Since the switching of the impurity gas by stopping the supply thereof is continuously performed in the same reaction chamber, it can maintain the productivity. The undoped gallium nitride layer 236, which is a nitride semiconductor layer containing the impurity at an extremely low concentration, acts as a high resistance region for preventing the flow of a current in the upper layer portion 235t. The undoped gallium nitride layer 236 is formed so as to bury the recessed central portion of the upper layer portion 235t and to have a top portion, which layer 236 also has thin side surface portions located on the side surface portions 235s so as to cover the peripheries of the side surface portions 235s. Since the upper layer portion 235t of the n-type gallium nitride layer 235 is continuous to the undoped gallium nitride layer 236 functioning as the high resistance region, a current flowing via the upper layer portion 235t is suppressed, with a result that a current flowing in an active layer 237, which is to be formed on the undoped gallium nitride layer 236, is also certainly suppressed on the upper layer portion 235t side.

An InGaN active layer 237 containing indium is formed on the undoped gallium nitride layer 236, and a p-type AlGaN layer 238 and a p-type gallium nitride layer 239 are stacked thereon. A p-electrode 240 is formed on the p-type gallium nitride layer 239 by vapor-depositing a metal material such as Ni/Pt/Au or Ni(Pd)/Pt/Au. An n-electrode 241 is formed in an opening portion 242 opened in the silicon oxide film 233 by vapor-depositing a metal material such as Ti/Al/Pt/Au.

Even in the device having such a structure, a current is efficiently injected to the active layer 237 on the side surface portion 235t side more than on the side of the upper layer portion 235t which has the recessed portion at its central portion and thereby has a thick high resistance region, to obtain a light emitting diode high in luminous efficiency with less leaked current. The n-type gallium nitride layer or the like is formed into a hexagonal pyramid shape in an embodiment; however, it may be formed into a stripe shape which has a triangular or trapezoidal shape in cross-section.

In a nitride semiconductor device according to an embodiment, n-type gallium nitride layers are formed in two steps, wherein a range of side surface portions in which a current is to be injected is specified.

Figure 18:
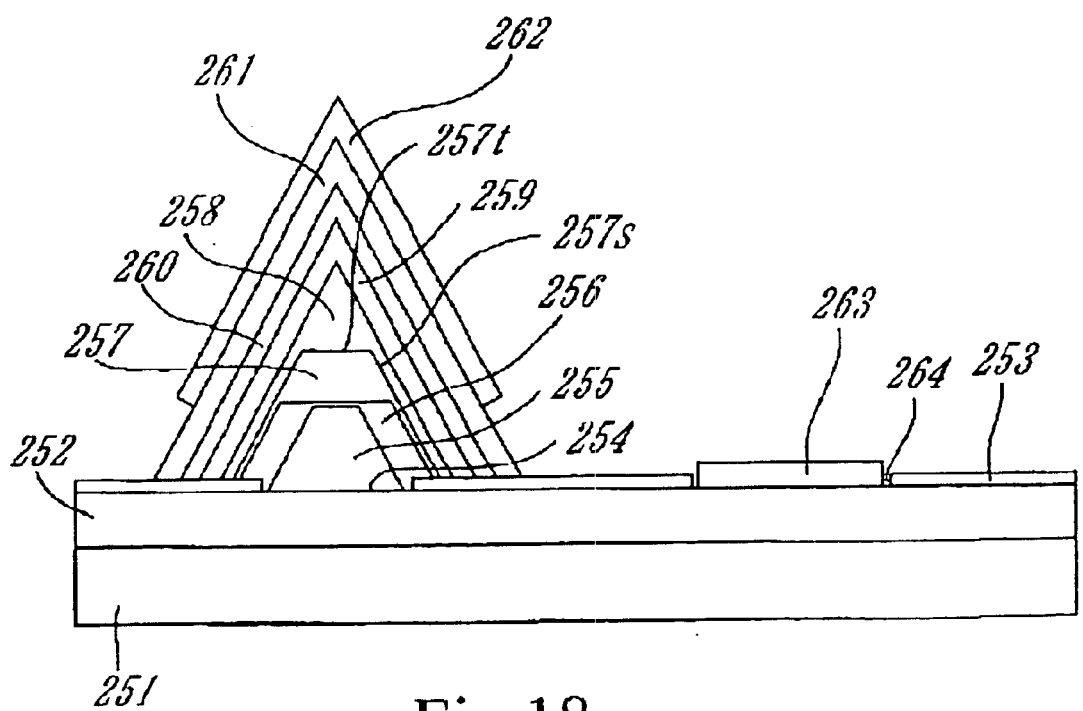
FIG. 18 is a sectional view of a semiconductor light emitting device according to an embodiment of the present invention.

FIG. 18 is a sectional view showing an inner configuration of a nitride semiconductor light emitting device according to an embodiment, with a p-electrode and an n-electrode formed thereon. An n-type gallium nitride layer 252 having a stacked structure of an undoped GaN layer and a silicon-doped GaN layer stacked thereon is formed on a sapphire substrate 251, and a silicon oxide film 253 is formed to cover the gallium nitride layer 252. Opening portions 254, each having a nearly normal hexagonal shape, are formed in the silicon oxide film 253, and a lower side n-type GaN layer 255 is formed by selective growth from each of the opening portions 254. The sapphire substrate 251 is a substrate using the C-plane of sapphire as the principal plane. The silicon-doped n-type gallium nitride layer 16 having tilt planes composed of the S-planes is thus formed by selective growth using the opening portion 254.

The n-type gallium nitride layer 255 is grown to a trapezoidal shape in cross-section, wherein the S-planes are taken as tilt planes and the C-plane is taken as an upper surface. An undoped gallium nitride layer 256 is formed around the n-type gallium nitride layer 255. The undoped gallium nitride layer 256 is relatively thick and thereby it has a high resistance, which layer is located on the tilt planes of the n-type gallium nitride layer 255 so as to cover the tilt plane portions close to the substrate of the device structure. The undoped gallium nitride layer 256 functions to allow the flow of a current only in part of the tilt planes. An upper side n-type gallium nitride layer 257 is formed on the undoped gallium nitride layer 256 in such a manner as to be continuous to the undoped gallium nitride layer 256. The upper side gallium nitride layer 257 is formed into a trapezoidal shape in cross-section, wherein tilt planes composed of the S-planes are taken as side surface portions 257s and the facet composed of the upper side C-plane is taken as an upper layer portion 257t.

An undoped gallium nitride layer 258 is formed on the upper side n-type gallium nitride layer 257. The undoped gallium nitride layer 258 has an upper portion having an approximately triangular shape in cross-section, which portion is located on the upper layer portion 257t, and has thin side surface portions located on the side surface portions 257s so as to cover the peripheries of the side surface portions 257s. Since the upper layer portion 257t of the n-type gallium nitride layer 257 is continuous to the undoped gallium nitride layer 258 functioning as the high resistance region, a current flowing via the upper layer portion 257t is suppressed, with a result that a current flowing in an active layer 259, which is to be formed on the undoped gallium nitride layer 257, is also suppressed.

An InGaN active layer 259 containing indium is formed on the undoped gallium nitride layer 258, and a p-type AlGaN layer 260 and a p-type gallium nitride layer 261 are stacked thereon. A p-electrode 262 is formed on the p-type gallium nitride layer 261 by vapor-depositing a metal material such as Ni/Pt/Au or Ni(Pd)/Pt/Au. An n-electrode 263 is formed in an opening portion 264 opened in the silicon oxide film 253 by vapor-depositing a metal material such as Ti/Al/Pt/Au.

In the device having such a structure, both the undoped gallium nitride layers 256 and 258 function as the high resistance regions, whereby a current flows mainly in the side surface portions 257s of the n-type gallium nitride layer 257 held between both the undoped gallium nitride layers 256 and 258. In other words, the current does not flow in both the top portion and the bottom surface portion each of which is poor in crystallinity. Accordingly, it is possible to realize a light emitting diode high in luminous efficiency with less leaked current. In addition, the n-type gallium nitride layer or the like is formed into a hexagonal pyramid shape in an embodiment; however, it may be formed into a stripe shape which has a triangular or trapezoidal shape in cross-section.

Figure 20:
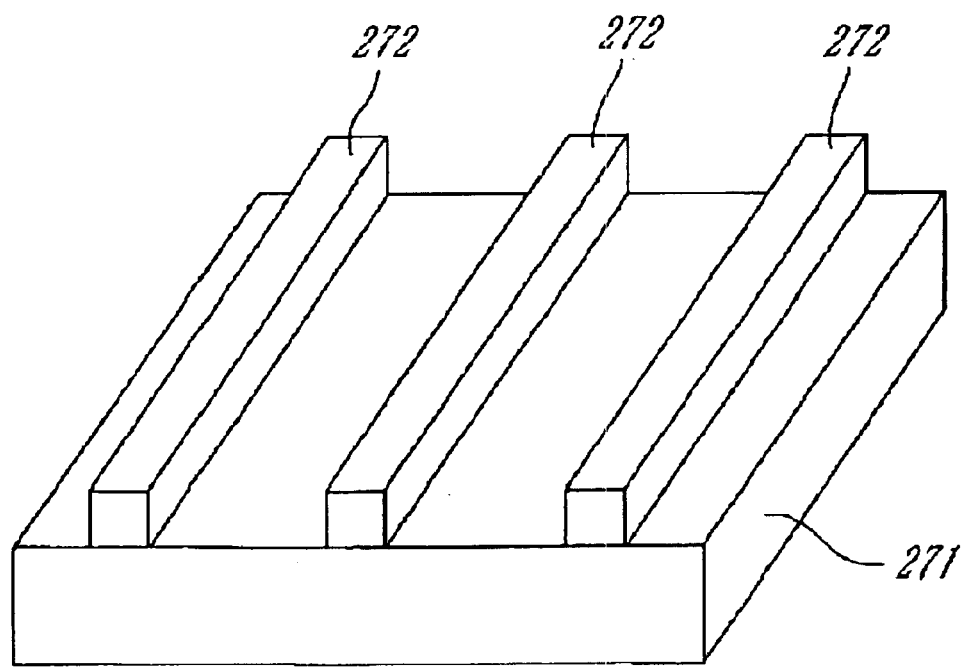
FIG. 20 is a perspective sectional view of steps of fabricating the semiconductor light emitting device according to an embodiment of the present invention, showing a state after the step of selectively removing the gallium nitride layer is terminated.
Figure 21:
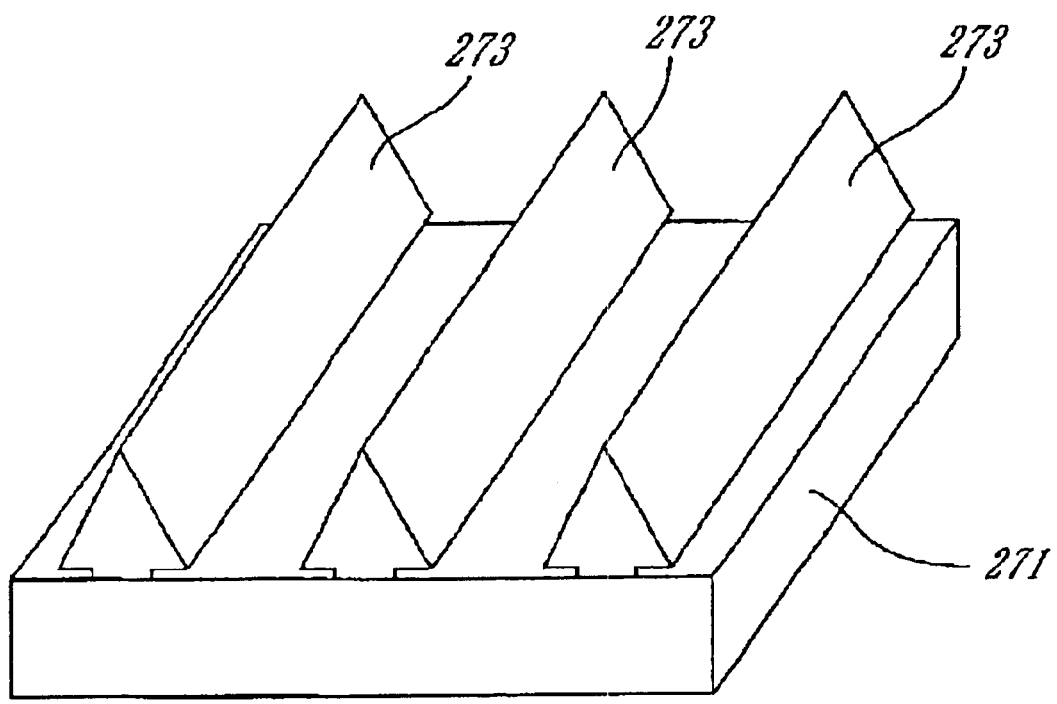
FIG. 21 is a perspective sectional view of steps of fabricating the semiconductor light emitting device according to an embodiment of the present invention, showing a state after the step of forming a nitride semiconductor device structure is terminated.

A method of fabricating a nitride semiconductor device according to an embodiment will be described in the order of steps with reference to FIGS. 19 to 21.

Figure 19:
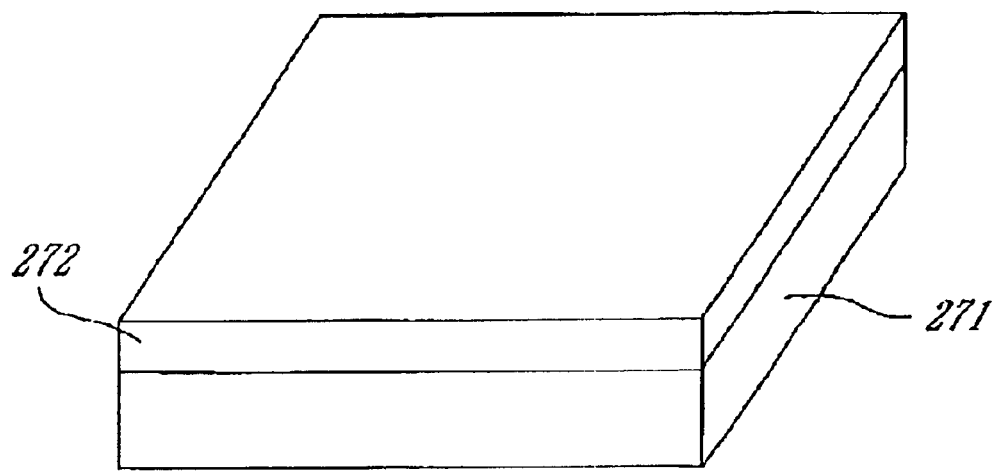
FIG. 19 is a perspective sectional view of steps of fabricating a semiconductor light emitting device according to an embodiment of the present invention, showing a state after the step of forming a gallium nitride layer is terminated.

As shown in FIG. 19, an n-type gallium nitride layer 272 is formed on a sapphire substrate 271 by a metal-organic chemical vapor deposition process. A resist layer is formed on the n-type gallium nitride layer 272 and is then selectively exposed and removed by photolithography. As shown in FIG. 20, each portion, between adjacent two of the remaining resist layer portions, of the n-type gallium nitride layer 272 is removed by reaction ion etching. The remaining n-type gallium nitride layer 272 has stripe shapes extending in parallel to the [1,1,–2,0] direction. The surface of the sapphire substrate 271 is partially exposed by partial removal of the n-type gallium nitride layer 272.

Nitride semiconductor crystal layers are then formed by the metal-organic chemical vapor deposition process. First, an n-type gallium nitride layer is formed by making a mixed gas of $H_2$ and $N_2$ as a carrier gas flow in a reaction chamber and supplying ammonia ($NH_3$) as an N source and trimethyl gallium (TMGa, $Ga(CH_3)_3$) as a Ga source. The supply of the impurity gas is then stopped, to form an undoped gallium nitride layer. After formation of the undoped gallium nitride layer, an InGaN active layer is formed by using trimethyl indium (IMG) or the like, and then the gas to be supplied to the reaction chamber is switched into another gas, to form an AlGaN layer and a p-type GaN layer. A nitride semiconductor device structure 273 having a triangular shape in cross-section shown in FIG. 21 is thus formed.

In the nitride semiconductor device structure 273, the undoped gallium nitride layer formed as an intermediate layer functions as a high resistance region, to suppress a current flowing in a top portion or the like being poor in crystallinity.

Figure 22A:
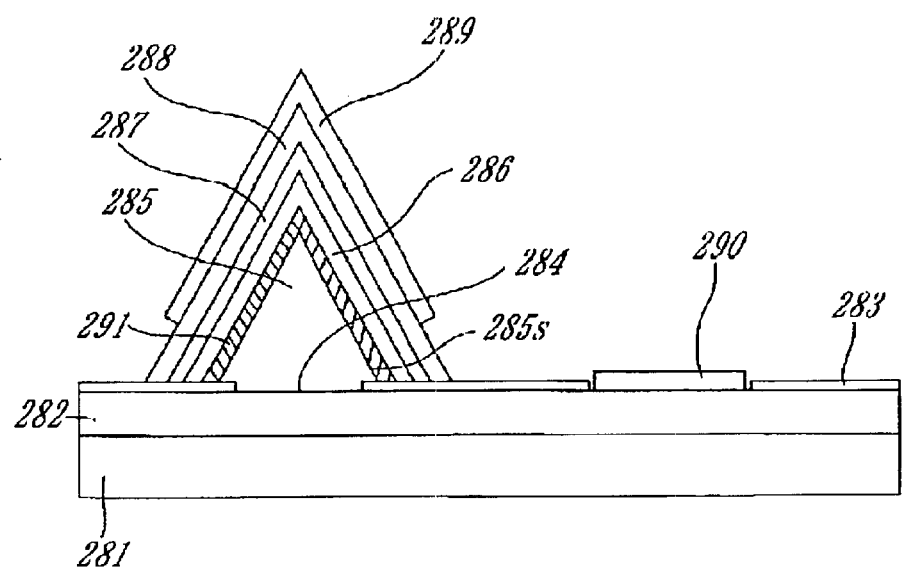
FIGS. 22A and 22B are a vertical sectional view and a horizontal sectional view of a semiconductor light emitting device according to an embodiment of the present invention, respectively.
Figure 22B:
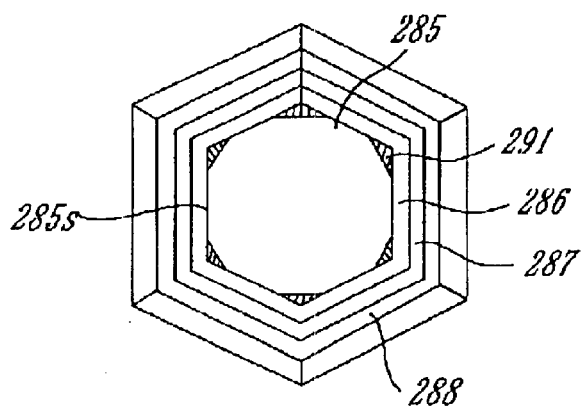

According to an embodiment, as shown in FIGS. 22A and 22B, an undoped portion functioning as a high resistance region is formed on each ridge portion of a nitride semiconductor light emitting device structure. In addition, FIG. 22A is a vertical sectional view taken on a line connecting opposed ridge portions to each other, showing the nitride semiconductor light emitting device structure.

FIG. 22A shows an inner configuration of the nitride semiconductor light emitting device structure according to an embodiment, with a p-electrode and an n-electrode formed thereto. An n-type gallium nitride layer 282 having a stacked structure of an undoped GaN layer and a silicon-doped GaN layer stacked thereon is formed on a sapphire substrate 281, and a silicon oxide film 283 is formed to cover the n-type gallium nitride layer 282. Opening portions 284, each having a nearly normal hexagonal shape, are formed in the silicon oxide film 283, and a silicon-doped n-type GaN layer 285 is formed by selective growth from each of the opening portions 284.

The n-type GaN layer 285 is formed by making a mixed gas of $H_2$ and $N_2$ as a carrier gas flow in a reaction chamber and supplying ammonia ($NH_3$) as an N source and trimethyl gallium (TMGa, $Ga(CH_3)_3$) as a Ga source. The n-type GaN layer 285 is doped with silicon as an impurity.

An InGaN active layer 286 containing indium is formed on the n-type GaN layer 285, and a p-type AlGaN layer 287 and a p-type gallium nitride layer 288 are stacked thereon. The p-type AlGaN layer 287 and the p-type gallium nitride layer 288 are each doped with magnesium as an impurity. A p-electrode 289 is formed on the p-type gallium nitride layer 288 by vapor-depositing a metal material such as Ni/Pt/Au or Ni(Pd)/Pt/Au. An n-electrode 290 is formed in an opening portion 284 opened in the silicon oxide film 283 by vapor-depositing a metal material such as Ti/Al/Pt/Au.

In the nitride semiconductor light emitting device structure according to an embodiment, as shown in FIGS. 22A and 22B, an undoped portion 291 is formed on each ridge portion. The undoped portion 291 contains an impurity at an extremely low concentration, and functions as to suppress a current in a portion, positioned at the ridge portion, of the n-type GaN layer 285, and to allow the flow of the current in the n-type GaN layer 285 mainly via flat surface portions composed of side surface portions 285s of the n-type GaN layer 285. Accordingly, a current is efficiently injected to the flat surface portions composed of the side surface portions 285s more than to the ridge portions poor in crystallinity, to obtain a light emitting diode high in luminous efficiency with less leaked current.

According to an embodiment, the opening portion 284 formed in the silicon oxide film 283 is configured to have a nearly normal hexagonal shape; however, the present invention is not limited thereto. For example, the shape of the opening portion 284 may be another polygonal shape or a circular shape. Even in this case, a crystal growth layer having a hexagonal pyramid shape similar to that described above can be formed from the opening portion 15 by adjusting a growth condition. The tilt side surface of the crystal growth layer is not limited to the S-plane but may be the {1,1,–2,2} plane. Even in this case, like the above-described light emitting device obtained using the S-planes, a light emitting device obtained using the {1,1,–2,2} planes can suppress the leaked current. Further, although the nitride semiconductor light emitting device structure in an embodiment is formed into a hexagonal pyramid shape, it may be formed into another polygonal pyramid shape or a polygonal truncated pyramid shape, or a stripe shape which has a triangular or trapezoidal shape in cross-section.

According to an embodiment, the undoped layer 191 is formed on the lower side from the InGaN active layer 286; however, it may be formed on the upper side from the InGaN active layer 286.

Figure 23A:
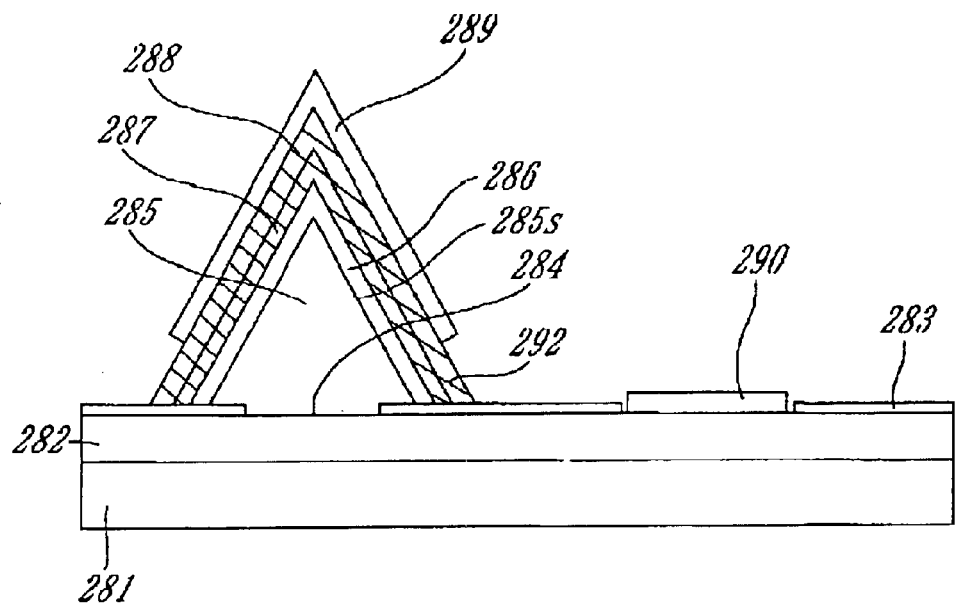
FIGS. 23A and 23B are a vertical sectional view and a horizontal sectional view of a semiconductor light emitting device according to an embodiment of the present invention, respectively.
Figure 23B:
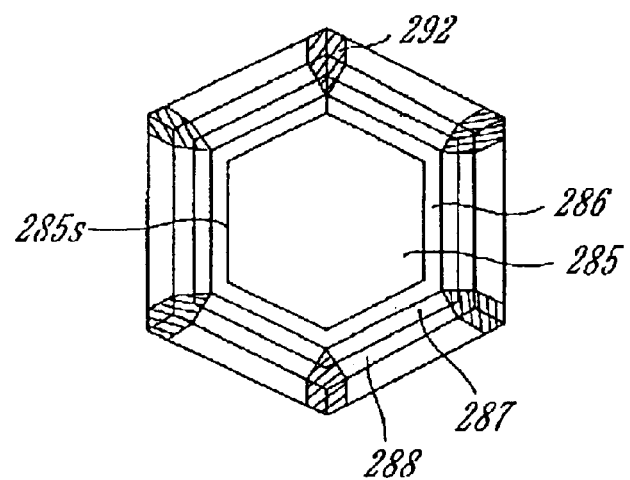

According to an embodiment, as shown in FIGS. 23A and 23B, a high resistance region is formed on each ridge portion of a nitride semiconductor light emitting device structure by implanting ions in the ridge portion by a so-called ion implantation process. FIG. 23A is a vertical sectional view taken on a line connecting opposed ridge portions to each other, showing the nitride semiconductor light emitting device structure. It is to be noted that in the nitride semiconductor light emitting device structure according to an embodiment, parts having the same configurations as those of the parts in the eighteenth embodiment are denoted by the same reference numerals and the overlapped explanation thereof is omitted.

FIG. 23A shows an inner configuration of the nitride semiconductor light emitting device structure according to an embodiment, with a p-electrode and an n-electrode formed thereon. In the nitride semiconductor light emitting device structure, as shown in FIGS. 23A and 23B, an ion implanted portion 292 functioning as a high resistance portion is formed on each ridge portion by implanting ions to the ridge portion. The ion implantation is performed by accelerating ions of nitrogen by using an ion implantation system and implanting the ions of nitrogen in the nitride semiconductor light emitting device structure. The ions of nitrogen to be implanted may be replaced with ions of aluminum. Also, the ion implantation may be performed by using focused ion beams.

A region in which ions have been implanted becomes a nitrogen semiconductor layer which contains the impurity at an extremely low concentration and thereby has a high resistance. Such a region functions to suppress the injection of a current in the portion, positioned at the ridge portion, of the n-type GaN layer 285, and to allow the flow of the current in the n-type GaN layer 285 mainly via flat surface portions composed of side surface portions 285$s$. Accordingly, a current is efficiently injected to the flat surface portions composed of the side surface portions 285$s$ more than to the ridge portions poor in crystallinity, to obtain a light emitting diode high in luminous efficiency with less leaked current.

Although the nitride semiconductor light emitting device structure in an embodiment is formed into a hexagonal pyramid shape, it may be formed into another polygonal pyramid shape or a polygonal truncated pyramid shape, or a stripe shape which has a triangular or trapezoidal shape in cross-section.

Figure 24A:
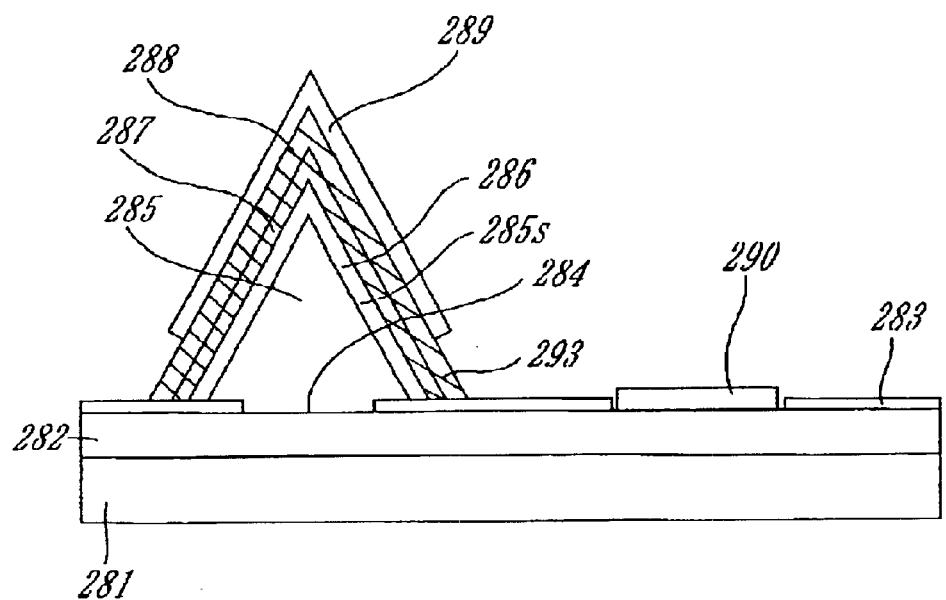
FIGS. 24A and 24B are a vertical sectional view and a horizontal sectional view of a semiconductor light emitting device according to an embodiment of the present invention, respectively.
Figure 24B:
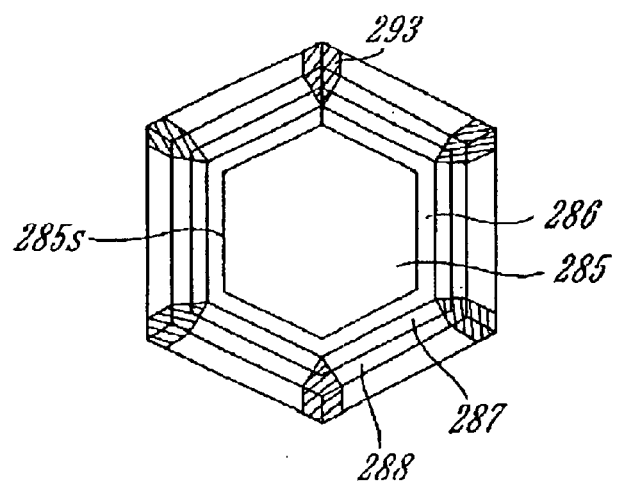

According to an embodiment, as shown in FIGS. 24A and 24B, a high resistance region is formed on each ridge portion of a nitride semiconductor light emitting device structure by selectively irradiating a portion other than the ridge portion with electron beams, thereby activating the portion other than the ridge portion. FIG. 24A is a vertical sectional view taken on a line connecting the opposed ridge portions to each other, showing a nitride semiconductor light emitting device structure. It is to be noted that in the nitride semiconductor light emitting device structure according to an embodiment, parts having the same configuration as those in the eighteenth embodiment are denoted by the same reference numerals and the overlapped explanation thereof is omitted.

FIG. 24A shows an inner configuration of the nitride semiconductor light emitting device structure according to an embodiment, with a p-electrode and an n-electrode formed thereon. In this nitride semiconductor light emitting device structure, as shown in FIGS. 24A and 24B, a portion, other than each ridge portion, of p-type nitride semiconductor layers is irradiated with electron beams.

The electron beam irradiation is needed to activate the p-type nitride semiconductor layers (p-type AlGaN layer 287 and the p-type gallium nitride layer 288), and the region, not irradiated with the electron beams, that is, the portion, located at each ridge portion, of the p-type nitride semiconductor layers is not activated to become a nitride semiconductor layer portion (hereinafter, a non-activated portion 293) which contains the impurity at an extremely low concentration and thereby has a high resistance. The non-activated portion 293 at the ridge portion functions to suppress the flow of a current in the ridge portion, and to allow the flow of the current in the n-type GaN layer 285 mainly via flat surface portions composed of side surface portions 285$s$. As a result, a current is efficiently injected to the flat surface portions composed of the side surface portions 285$s$ more than to the ridge portions poor in crystallinity, to obtain a light emitting diode high in luminous efficiency with less leaked current.

Although the nitride semiconductor light emitting device structure in this embodiment is formed into a hexagonal pyramid shape, it may be formed into another polygonal pyramid shape or a polygonal truncated pyramid shape, or a stripe shape which has a triangular or trapezoidal shape in cross-section.

Figure 25:
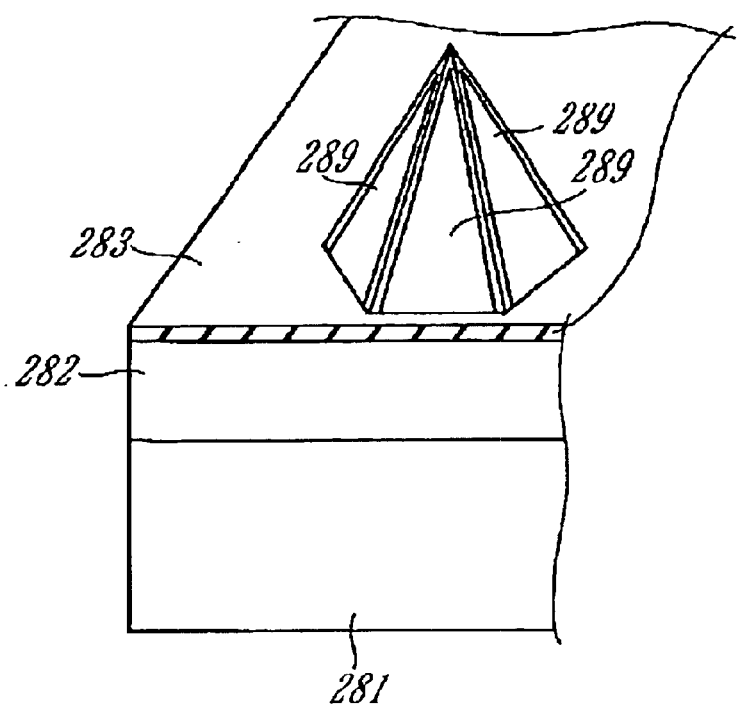
FIG. 25 is a perspective view of a semiconductor light emitting device according to an embodiment of the present invention.

According to an embodiment, as shown in FIG. 25, a p-electrode is formed only on a portion other than ridge portions of a nitride semiconductor light emitting device structure. It is to be noted that in the nitride semiconductor light emitting device structure according to an embodiment, parts having the same configuration as those in the eighteenth embodiment are denoted by the same reference numerals and the detailed explanation thereof is omitted. In the nitride semiconductor light emitting device having such a configuration, since a p-electrode 289 is selectively formed on a portion other than ridge portions, a current flows in an n-type GaN layer 285 mainly via flat surface portions composed of side surface portions 285$s$ on which the p-electrode 289 is formed. Accordingly, a current is efficiently injected to the flat surface portions composed of the side surface portions 285$s$ more than to the ridge portions poor in crystallinity, to obtain a light emitting diode high in luminous efficiency with less leaked current.

Although the nitride semiconductor light emitting device structure in an embodiment is formed into a hexagonal pyramid shape, it may be formed into another polygonal pyramid shape or a polygonal truncated pyramid shape, or a stripe shape which has a triangular or trapezoidal shape in cross-section.

Figure 26:
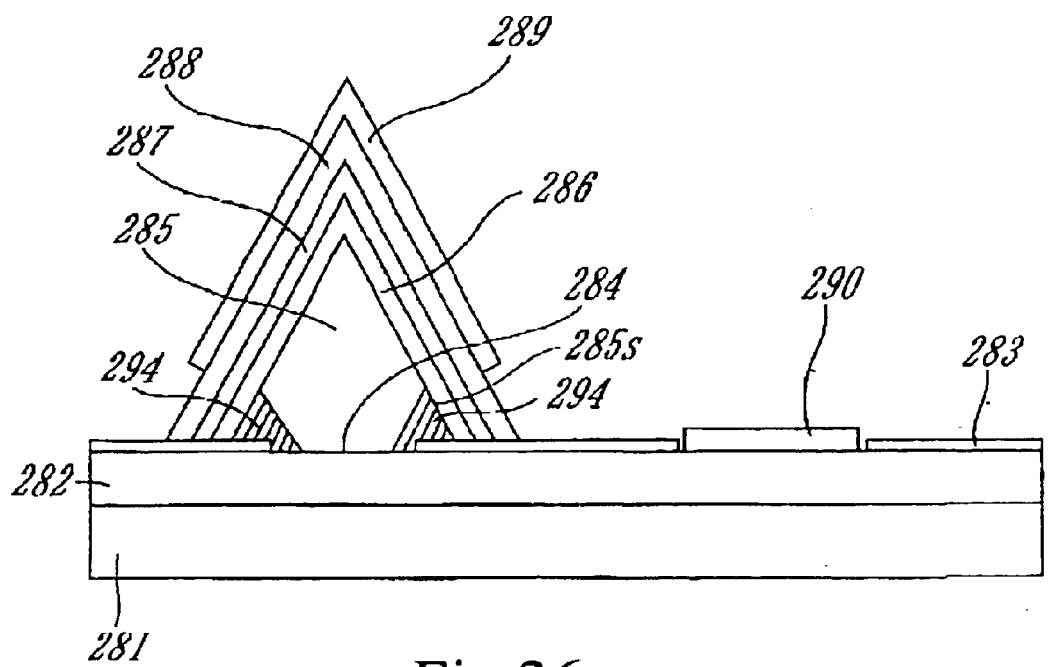
FIG. 26 is a perspective view of a semiconductor light emitting device according to an embodiment of the present invention.

According to an embodiment, as shown in FIG. 26, an undoped portion functioning as a high resistance region is formed on a bottom side portion of a nitride semiconductor light emitting device structure. It is to be noted that in the nitride semiconductor light emitting device structure according to an embodiment, parts having the same configuration as those in the eighteenth embodiment are denoted by the same reference numerals and the detailed explanation thereof is omitted.

FIG. 26 is a sectional view showing an inner configuration of a nitride semiconductor light emitting device structure according to an embodiment, with a p-electrode and an n-electrode formed thereto. In the nitride semiconductor light emitting device structure according to an embodiment, an undoped portion 294 is formed on each bottom side portion as shown in FIG. 26. The undoped portion 294 contains an impurity at an extremely low concentration, and functions to suppress the injection of a current in a portion, located at the bottom side portion, of an n-type GaN layer 285 and to allow the flow of the current in the n-type GaN layer 285 mainly via flat surface portions composed of side surface portions 285$s$. Accordingly, a current is efficiently injected to the flat surface portions composed of the side surface portions 285$s$ more than to ridge portions poor in crystallinity, to obtain a light emitting diode high in luminous efficiency with less leaked current.

According to an embodiment, an opening portion 284 formed in a silicon oxide film 283 is configured to have a nearly normal hexagonal shape; however, the present invention is not limited thereto. For example, the shape of the opening portion 284 may be another polygonal shape or a circular shape. Even in this case, a crystal growth layer having a hexagonal pyramid shape similar to that described above can be formed from the opening portion 284 by adjusting a growth condition. The tilt side surface is not limited to the S-plane but may be the {1,1,-2,2} plane. Even in this case, like the above-described light emitting device obtained using the S-planes, a light emitting device obtained using the {1,1,-2,2} planes can suppress the leaked current. Although the nitride semiconductor light emitting device structure in an embodiment is formed into a hexagonal pyramid shape, it may be formed into another polygonal pyramid shape or a polygonal truncated pyramid shape, or a stripe shape which has a triangular or trapezoidal shape in cross-section.

According to an embodiment, the undoped layer 294 is formed on the lower side from the InGaN active layer 286 but may be formed on the upper side from the InGaN active layer 286.

Figure 27:
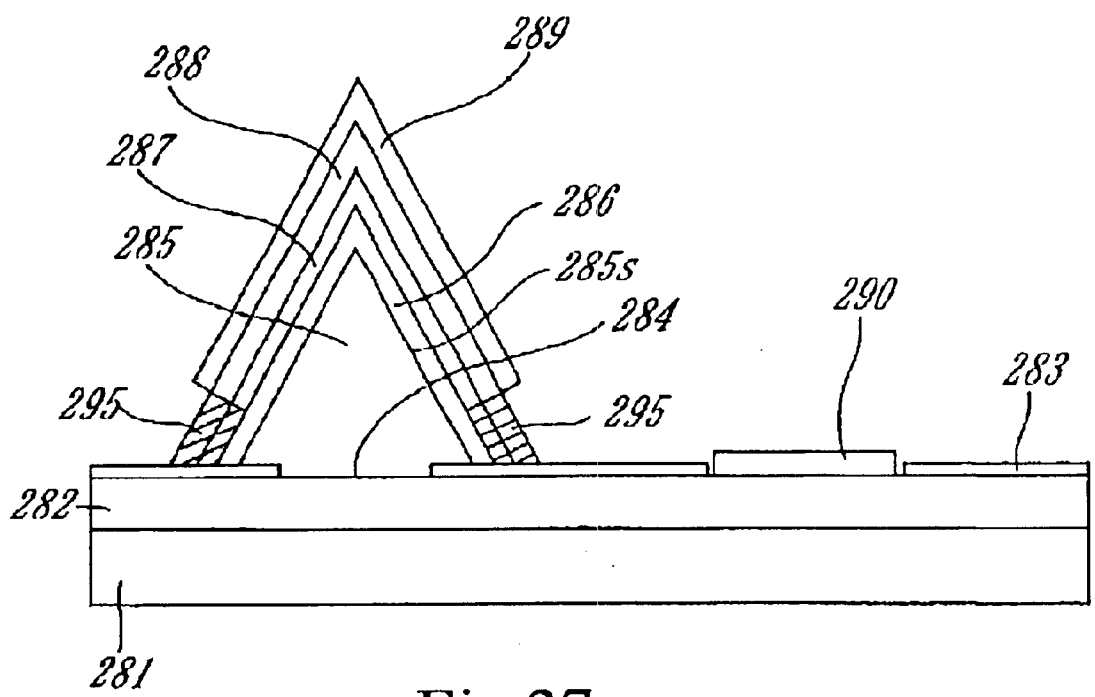
FIG. 27 is a perspective view of a semiconductor light emitting device according to an embodiment of the present invention.

According to an embodiment, as shown in FIG. 27, a high resistance region is formed on each bottom side portion of a nitride semiconductor light emitting device structure by implanting ions in the bottom side portion by a so-called ion implantation process. It is to be noted that in the nitride semiconductor light emitting device structure according to an embodiment, parts having the same configurations as those of the parts in the eighteenth embodiment are denoted by the same reference numerals and the overlapped explanation thereof is omitted.

FIG. 27 shows an inner configuration of the nitride semiconductor light emitting device structure according to an embodiment, with a p-electrode and an n-electrode formed thereon. In the nitride semiconductor light emitting device structure, as shown in FIG. 27, an ion implanted portion 295 functioning as a high resistance portion is formed on each bottom side portion by implanting ions to the bottom side portion. The ion implantation is performed by accelerating ions of nitrogen by using an ion implantation system and implanting the ions of nitrogen in the nitride semiconductor light emitting device structure. The ions of nitrogen to be implanted may be replaced with ions of aluminum. Also, the ion implantation may be performed by using focused ion beams.

The ion implanted portion 295 formed by ion implantation becomes a nitride semiconductor layer which contains the impurity at an extremely low concentration and thereby has a high resistance. Such a portion 295 functions to suppress the injection of a current in the portion, positioned at the bottom side portion, of an n-type GaN layer 285, and to allow the flow of the current in the n-type GaN layer 285 mainly via flat surface portions composed of side surface portions 285s. As a result, a current is efficiently injected to the flat surface portions composed of the side surface portions 285s more than to the bottom side portions poor in crystallinity, to obtain a light emitting diode high in luminous efficiency with less leaked current.

Although the nitride semiconductor light emitting device structure in this embodiment is formed into a hexagonal pyramid shape, it may be formed into another polygonal pyramid shape or a polygonal truncated pyramid shape, or a stripe shape which has a triangular or trapezoidal shape in cross-section.

Figure 28:
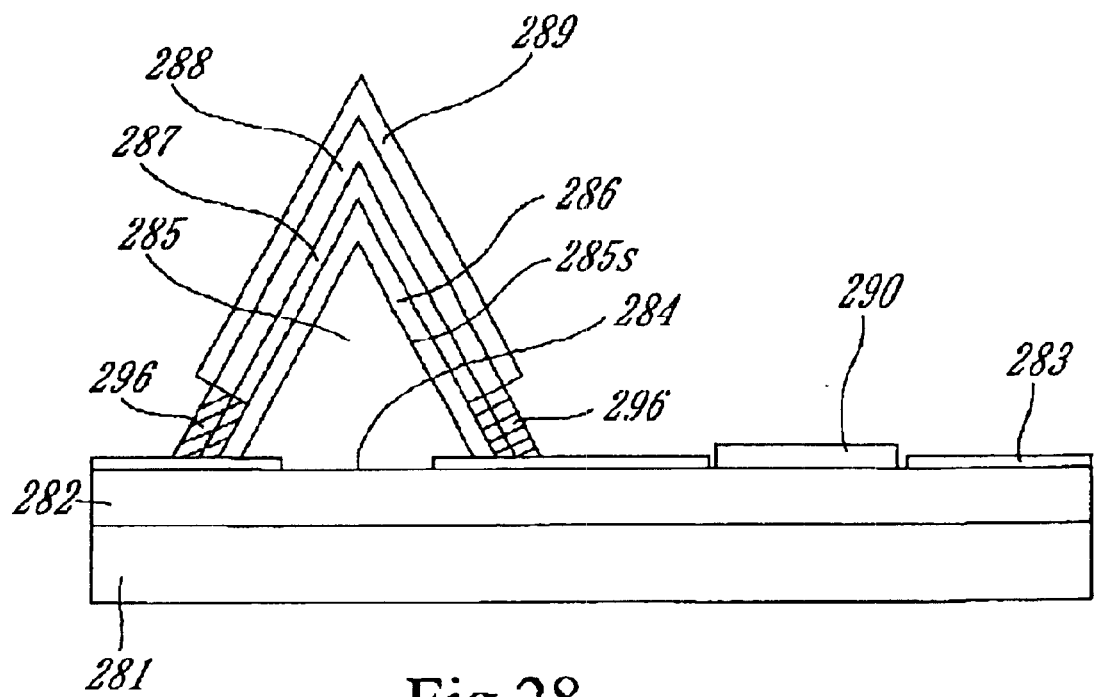
FIG. 28 is a perspective view of a semiconductor light emitting device according to an embodiment of the present invention.

According to an embodiment, as shown in FIG. 28, a high resistance region is formed on each bottom side portion of a nitride semiconductor light emitting device structure by selectively irradiating a portion other than the bottom side portion with electron beams, thereby activating the portion other than the bottom side portion. It is to be noted that in the nitride semiconductor light emitting device structure according to an embodiment, parts having the same con-figuration as those in the eighteenth embodiment are denoted by the same reference numerals and the overlapped explanation thereof is omitted.

FIG. 28 is a sectional view showing an inner configuration of the nitride semiconductor light emitting device structure according to an embodiment, with a p-electrode and an n-electrode formed thereon. In this nitride semiconductor light emitting device structure, as shown in FIG. 28, a portion, other than each bottom side portion, of p-type nitride semiconductor layers is irradiated with electron beams.

The electron beam irradiation is needed to activate the p-type nitride semiconductor layers (p-type AlGaN layer 287 and p-type gallium nitride layer 288), and the region, not irradiated with the electron beams, that is, the portion, located at each bottom side portion, of the p-type nitride semiconductor layers is not activated to become a nitride semiconductor layer portion (hereinafter, a non-activated portion 296) which contains the impurity at an extremely low concentration and thereby has a high resistance. The non-activated portion 296, which is the nitride semiconductor layer having the high resistance and located at the bottom side portion, functions to suppress the flow of a current in the bottom side portion, and to allow the flow of the current in an n-type GaN layer 285 mainly via flat surface portions composed of side surface portions 285s. As a result, a current is efficiently injected to the flat surface portions composed of the side surface portions 285s more than to the bottom side portions poor in crystallinity, to obtain a light emitting diode high in luminous efficiency with less leaked current.

Although the nitride semiconductor light emitting device structure in an embodiment is formed into a hexagonal pyramid shape, it may be formed into another polygonal pyramid shape or a polygonal truncated pyramid shape, or a stripe shape which has a triangular or trapezoidal shape in cross-section.

Figure 29:
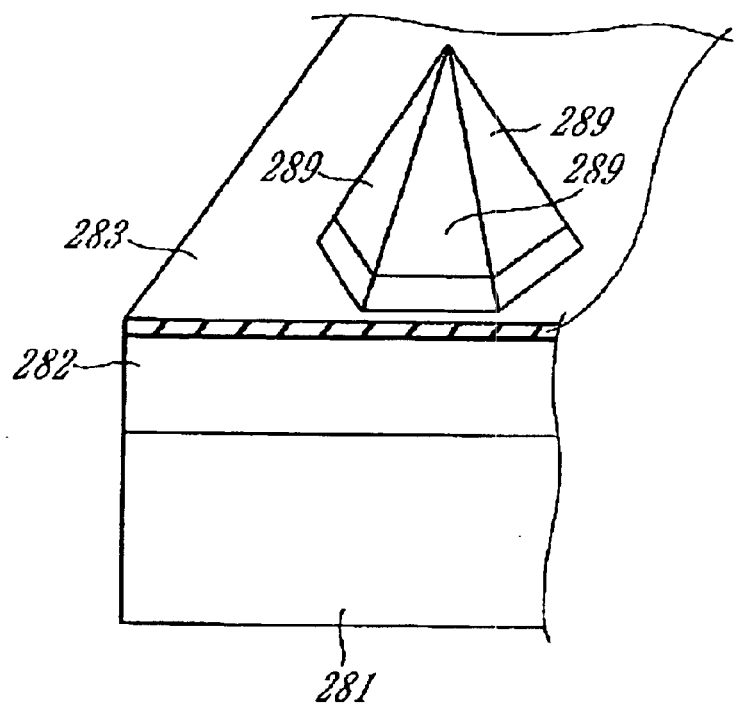
FIG. 29 is a perspective view of a semiconductor light emitting device according to an embodiment of the present invention.
Figure 30:
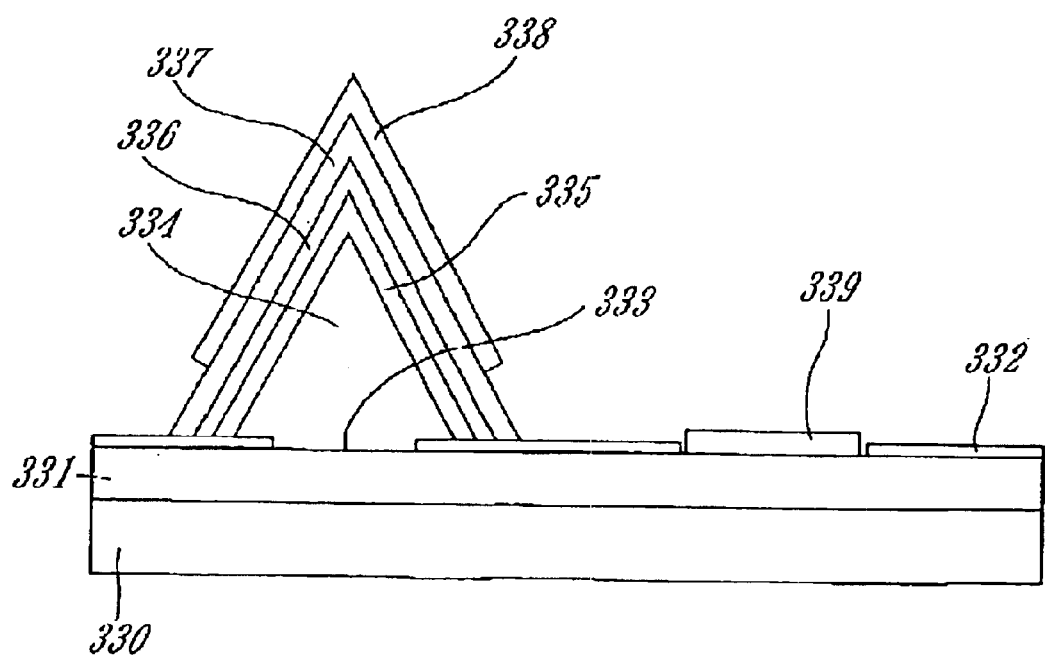
FIG. 30 is a sectional view showing one example of a semiconductor light emitting device.
Figure 31:
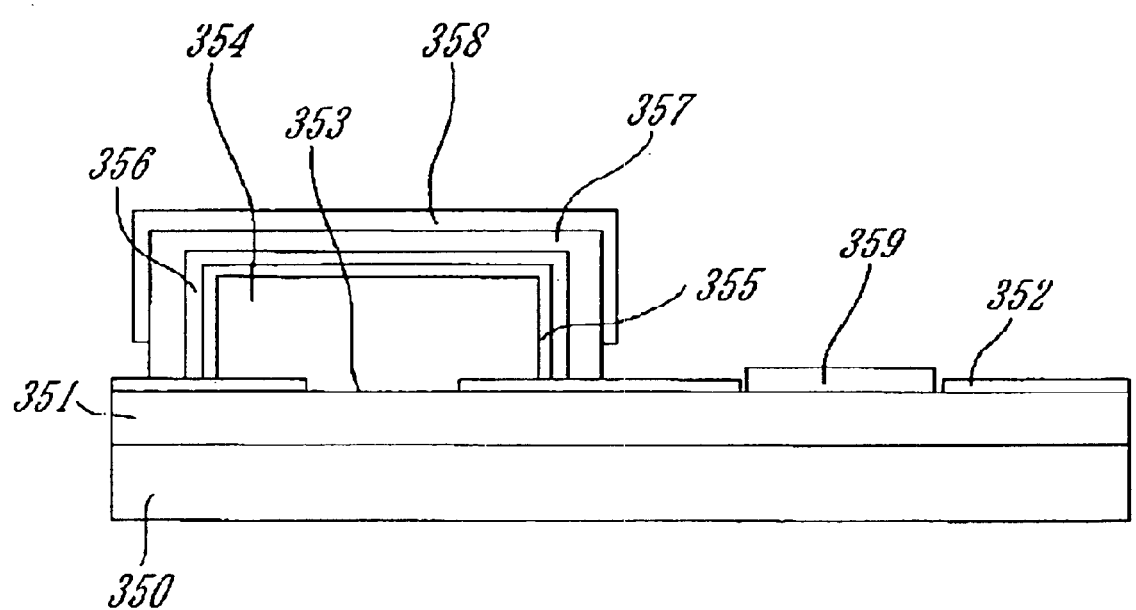
FIG. 31 is a sectional view showing another example of a semiconductor light emitting device.

According to an embodiment, as shown in FIG. 29, a p-electrode is formed only on a portion other than bottom side portions of a nitride semiconductor light emitting device structure. It is to be noted that in the nitride semiconductor light emitting device structure according to an embodiment, parts having the same configuration as those in the eighteenth embodiment are denoted by the same reference numerals and the detailed explanation thereof is omitted.

In the nitride semiconductor light emitting device having such a configuration, since a p-electrode 289 is selectively formed on a portion other than bottom side portions, a current flows in an n-type GaN layer 285 mainly via flat surface portions composed of side surface portions 285s on which the p-electrode 289 is formed. As a result, a current is efficiently injected to the flat surface portions composed of the side surface portions 285s more than to the bottom side portions poor in crystallinity, to obtain a light emitting diode high in luminous efficiency with less leaked current.

Although the nitride semiconductor light emitting device structure in an embodiment is formed into a hexagonal pyramid shape, it may be formed into another polygonal pyramid shape or a polygonal truncated pyramid shape, or a stripe shape which has a triangular or trapezoidal shape in cross-section.

In the above-described embodiments, the present invention is applied mainly to the device having a light emitting diode structure; however, the present invention can be applied to a semiconductor laser formed by forming resonance planes on a device having the same configuration as that of the device having a light emitting diode structure. Also, the nitride semiconductor device according to the present invention is not limited to a semiconductor light emitting device, but may be a field-effect transistor, light receiving device, or any other optical part.

According to the nitride semiconductor device and the method of fabricating the nitride semiconductor device according to an embodiment of the present invention, a current for operating the nitride semiconductor device is injected from an electrode layer, and in this case, since a high resistance region is provided on an upper layer portion, the current flows so as to bypass the high resistance region of the upper layer portion, to form a current path extending mainly along a side surface portion while avoiding the upper layer portion. By using such a current path, it is possible to suppress the flow of the current in the upper layer portion poor in crystallinity, and hence to realize a device high in luminous efficiency with less leaked current.

In fabrication of the nitride semiconductor device according to an embodiment of the present invention, a high resistance region is formed in the crystal growth step without use of an external process such as photolithography, thereby simplifying the fabrication process. Also, since it is possible to form a high resistance layer in the vicinity of an active layer without use of the difficult process such as photolithography on a semiconductor device having a three-dimensional shape, and hence to suppress the wrap-around of a current leak path due to spread of the current as compared with the case where a high resistance portion is formed on an external portion.

According to the nitride semiconductor device of an embodiment of the present invention, a current for operating the nitride semiconductor device is injected from an electrode layer, and in this case, since a high resistance region is formed on a ridge portion and a region extending along the ridge portion or a bottom side portion and a region extending along the bottom side portion, a current flows so as to bypass the high resistance region, to form a current path extending mainly along a side surface portion, concretely, along a flat surface portion composed of the side surface portion. By using such a current path, it is possible to suppress the flow of a current in the ridge portion poor in crystallinity and the region extending along the ridge portion or the bottom side portion and the region extending along the bottom side portion, and hence to realize a device high in luminous efficiency with less leaked current.

According to the nitride semiconductor device of an embodiment of the present invention, a current for operating the nitride semiconductor device is injected from an electrode layer, and in this case, since the electrode layer is not formed on a ridge portion and a region extending along the ridge portion or a bottom side portion and a region extending along the bottom side portion, a current path mainly extending along a side surface portion on which the electrode layer is formed, concretely, along a flat surface portion composed of the side surface portion, can be formed. By using such a current path, it is possible to suppress the flow of a current in the ridge portion poor in crystallinity and the region extending along the ridge portion or the bottom side portion and the region extending along the bottom side portion, and hence to realize a device high in luminous efficiency with less leaked current.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A nitride semiconductor device comprising a crystal layer grown in a three-dimensional shape that has a side surface portion and an upper layer portion, wherein an electrode layer is formed on the upper layer portion over a high resistance region.

2. The nitride semiconductor device according to claim 1, wherein the side surface portion includes a tilt plane of the crystal layer.

3. The nitride semiconductor device according to claim 1, wherein the upper layer portion is formed into a shape selected from the group consisting of a truncated shape and a planar shape.

4. The nitride semiconductor device according to claim 1, wherein the crystal layer is formed by forming an anti-growth film on a nitride semiconductor layer including a nitride semiconductor substrate, and selectively growing the crystal layer from an opening portion opened in the anti-growth film.

5. The nitride semiconductor device according to claim 1, wherein the crystal layer is formed by selectively removing a portion of a nitride semiconductor layer including a nitride semiconductor substrate, and growing the crystal layer from a remaining portion of the nitride semiconductor layer.

6. The nitride semiconductor device according to claim 1, wherein a bottom surface portion of the crystal layer is formed into a stripe shape.

7. The nitride semiconductor device according to claim 1, wherein a bottom surface portion of said crystal layer is formed into a polygonal shape.

8. The nitride semiconductor device according to claim 1, wherein the crystal layer is formed on a substrate and has a plane parallel to the substrate, the plane parallel to the substrate being tilted at an angle of $\pm 10°$ or less with respect to the C-plane of a wurtzite type crystal structure.

9. The nitride semiconductor device according to claim 1, wherein the side surface portion of the crystal layer is tilted at an angle of $\pm 10°$ or less with respect to a plane of a wurtzite type crystal structure selected from the group consisting of $\{1,1,-2,-2\}$ plane, the $\{1,-1,0,1\}$, the $\{1,1,-2,0\}$ plane, and the $\{1,-1,0,0\}$ plane of a wurtzite type crystal structure.

10. The nitride semiconductor device according to claim 1, wherein the high resistance region is formed by an undoped nitride semiconductor layer.

11. The nitride semiconductor device according to claim 1, wherein the high resistance region is formed by a nitride semiconductor layer doped with a p-type impurity.

12. The nitride semiconductor device according to claim 1, wherein the high resistance region is formed by a nitride semiconductor layer doped with an n-type impurity.

13. The nitride semiconductor device according to claim 1, wherein the high resistance region is formed on the upper layer portion over an active layer.

14. The nitride semiconductor device according to claim 1, wherein an active layer is formed on the upper layer portion over the high resistance region.

15. A nitride semiconductor device comprising a crystal layer grown on a nitride semiconductor layer including a nitride semiconductor substrate, the crystal layer comprising a first crystal portion, a second crystal portion wherein the first crystal portion has a greater crystallinity than the second crystal portion, and an electrode layer that is formed on the second crystal portion over a high resistance region.

16. A nitride semiconductor device comprising a crystal layer grown into a three-dimensional shape having a side surface portion and an upper layer portion, a first conductive region and a second conductive region that are formed on the crystal layer, wherein a resistance value between the first conductive region and the second conductive region on the upper layer portion side is larger than a resistance value between the first conductive region and the second conductive region on the side surface portion side.

17. The nitride semiconductor device according to claim 16, wherein the resistance value between the first conductive region and the second conductive region on the upper layer portion side is 1.5 times or more larger than the resistance value between the first conductive region and the second conductive region on the side surface portion side.

18. The nitride semiconductor device according to claim 16, wherein the resistance value between the first conductive region and the second conductive region on the upper layer portion side is two times or more larger than the resistance value between the first conductive region and the second conductive region on the side surface portion side.

19. A method of fabricating a nitride semiconductor device, the method comprising the steps of:
    forming a crystal layer on a nitride semiconductor layer including a nitride semiconductor substrate by selective growth;
    continuously forming a high resistance region by changing a crystal growth condition after formation of an upper layer portion of the crystal layer; and
    forming an electrode layer after formation of the high resistance region.

20. The method of fabricating a nitride semiconductor device according to claim 19, wherein the step of forming the crystal layer by selective growth comprises forming an anti-growth film on the nitride semiconductor layer, and growing the crystal layer from an opening portion opened in the anti-growth film.

21. The method of fabricating a nitride semiconductor device according to claim 19, wherein the step of forming a crystal layer by selective growth comprises selectively removing a portion of the nitride semiconductor layer, and growing the crystal layer from a remaining portion of the nitride semiconductor layer.

22. The method of fabricating a nitride semiconductor device according to claim 19, wherein the high resistance region is formed so as to provide a top portion of the crystal layer that has a cross-sectional triangular shape.

23. The method of fabricating a nitride semiconductor layer according to claim 19, wherein the high resistance region is formed without doping any impurity to the region.

24. A nitride semiconductor device comprising a crystal layer grown into a three-dimensional shape having a ridge portion, and an electrode layer that is formed on both the ridge portion and a region extending along the ridge portion over a high resistance region.

25. The nitride semiconductor device according to claim 24, wherein the high resistance region is formed by providing an undoped portion.

26. The nitride semiconductor device according to claim 24, wherein the high resistance region is formed by providing an ion implanted portion formed by ion implantation.

27. The nitride semiconductor device according to claim 24, wherein the high resistance region is formed by selectively irradiating a portion, other than the ridge portion and the region extending along the ridge portion, of a nitride semiconductor layer doped with a p-type impurity with electron beams.

28. The nitride semiconductor device according to claim 24, wherein an upper layer portion of the crystal layer is formed into a shape selected from the group consisting of a truncated shape and a planar shape.

29. The nitride semiconductor device according to claim 24, wherein a bottom surface portion of the crystal layer is formed into a polygonal shape.

30. The nitride semiconductor device according to claim 24, wherein a bottom surface portion of the crystal layer is formed into a stripe shape.

31. A nitride semiconductor device comprising a crystal layer grown into a three-dimensional shape, and an electrode layer that is formed on both a bottom portion of the crystal layer and a region extending from the bottom portion over a high resistance region.

32. The nitride semiconductor device according to claim 31, wherein the high resistance region is formed by providing an undoped portion.

33. The nitride semiconductor device according to claim 31, wherein the high resistance region is formed by providing an ion implanted portion formed by ion implantation.

34. The nitride semiconductor device according to claim 31, wherein the high resistance region is formed by selectively irradiating a portion, other than a ridge portion and a region extending along the ridge portion, of a nitride semiconductor layer doped with a p-type impurity with electron beams.

35. The nitride semiconductor device according to claim 31, wherein an upper layer portion of the crystal layer is formed into a shape selected from the group consisting of a truncated shape and a planar shape.

36. The nitride semiconductor device according to claim 31, wherein a bottom surface portion of the crystal layer includes a polygonal shape.

37. The nitride semiconductor device according to claim 31, wherein a bottom surface portion of the crystal layer includes a stripe shape.

38. A nitride semiconductor device comprising a crystal layer grown into a three-dimensional shape, and an electrode layer that is formed on a flat surface portion of the crystal layer other than a ridge portion and a region extending along the ridge portion of the crystal layer.

39. The nitride semiconductor device according to claim 38, wherein an upper layer portion of the crystal layer includes a shape selected from the group consisting of a truncated shape and a planar shape.

40. The nitride semiconductor device according to claim 38, wherein a bottom surface portion of the crystal layer includes a polygonal shape.

41. A nitride semiconductor device according to claim 38, wherein a bottom surface portion of the crystal layer is shaped in a stripe shape.

42. A nitride semiconductor device comprising a crystal layer grown into a three-dimensional shape, wherein an electrode layer is formed on a flat surface portion of the crystal layer other than a bottom side portion and a region extending along the bottom side portion, of the crystal layer.

43. The nitride semiconductor device according to claim 42, wherein an upper layer portion of the crystal layer includes a shape selected from the group consisting of a truncated shape and a planar shape.

44. The nitride semiconductor device according to claim 42, wherein a bottom surface portion of the crystal layer includes a polygonal shape.

45. The nitride semiconductor device according to claim 42, wherein a bottom surface portion of the crystal layer includes a stripe shape.

46. A nitride semiconductor device comprising a crystal layer grown into a three-dimensional shape having a side surface portion and an upper layer portion, wherein an electrode layer is formed on the side surface portion and not on an upper layer portion.

47. The nitride semiconductor device according to claim 46, wherein the electrode layer is not formed at least a portion of a ridge portion and proximity thereof and a bottom surface portion and proximity thereof of the neighborhood of the side surface portion of the crystal layer.

48. The nitride semiconductor device according to claim 46, wherein an upper layer portion of the crystal layer includes a shape selected from the group consisting of a truncated shape and a planar shape.

49. The nitride semiconductor device according to claim 46, wherein a bottom surface portion of the crystal layer includes a polygonal shape.

50. The nitride semiconductor device according to claim 46, wherein a bottom surface portion of the crystal layer includes a stripe shape.

* * * * *